United States Patent
Huang et al.

(10) Patent No.: US 10,332,471 B2
(45) Date of Patent: Jun. 25, 2019

(54) PULSE GENERATION DEVICE, ARRAY SUBSTRATE, DISPLAY DEVICE, DRIVE CIRCUIT AND DRIVING METHOD

(71) Applicant: Xiamen Tianma Micro-Electronics Co., Ltd., Xiamen (CN)

(72) Inventors: Qiangcan Huang, Xiamen (CN); Tao Peng, Xiamen (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 62 days.

(21) Appl. No.: 15/793,844

(22) Filed: Oct. 25, 2017

(65) Prior Publication Data

US 2018/0314117 A1 Nov. 1, 2018

(30) Foreign Application Priority Data

Apr. 28, 2017 (CN) .......................... 2017 1 0294644

(51) Int. Cl.
*G09G 3/36* (2006.01)
*G11C 19/28* (2006.01)

(52) U.S. Cl.
CPC ......... *G09G 3/3677* (2013.01); *G11C 19/287* (2013.01); *G09G 2310/0251* (2013.01); *G09G 2310/0286* (2013.01)

(58) Field of Classification Search
CPC ....... G09G 2310/0286; G09G 2310/08; G09G 2310/0267; G09G 2310/0243; G09G 2310/0264; G09G 3/3677; G09G 3/2092; G09G 3/3674; G09G 5/003; G09G 2230/00; G11C 19/28; G11C 19/287; G11C 19/184; G11C 19/00; G02F 1/13454

See application file for complete search history.

(56) References Cited

U.S. PATENT DOCUMENTS

| 8,344,923 B1 * | 1/2013 | Cripe | ...................... H03M 1/72 341/136 |
| 9,563,396 B2 * | 2/2017 | Huang | ...................... G06F 5/01 |
| 2017/0193960 A1 * | 7/2017 | Peng | ...................... G11C 19/28 |

(Continued)

FOREIGN PATENT DOCUMENTS

| CN | 105929586 A | 9/2016 |
| CN | 106128378 A | 11/2016 |

OTHER PUBLICATIONS

Chinese Office Action for the corresponding Chinese Application Serial No. 201710294644.X, dated Nov. 2, 2018, pp. 1-5.

*Primary Examiner* — Darlene M Ritchie
(74) *Attorney, Agent, or Firm* — Tarolli, Sundheim, Covell & Tummino LLP

(57) ABSTRACT

Embodiments of the present disclosure provide a pulse generation device, an array substrate, a drive circuit and a driving method. The pulse generation device includes: a reset module making a pulse output end output low level, in response to a low level of a first input end or in response to a low level of a second input end and a low level of a third input end; a pulse generation module making the pulse output end output a high level, in response to a high level of the first input end, a high level of the second input end and a low level of the third input end or in response to a high level of the first input end, a low level of the second input end and a high level of the third input end.

11 Claims, 15 Drawing Sheets

(56) References Cited

U.S. PATENT DOCUMENTS

| | | | |
|---|---|---|---|
| 2018/0061346 A1* | 3/2018 | Zhao | G09G 3/3677 |
| 2018/0204495 A1* | 7/2018 | Wang | G11C 19/28 |
| 2018/0226035 A1* | 8/2018 | Wang | G09G 3/3648 |

* cited by examiner

PULSE GENERATION DEVICE, ARRAY SUBSTRATE, DISPLAY DEVICE, DRIVE CIRCUIT AND DRIVING METHOD

CROSS-REFERENCE TO RELATED APPLICATIONS

The present application claims the benefit of priority to Chinese Patent Application No. 201710294644.X, filed on Apr. 28, 2017, the content of which is incorporated herein by reference in its entirety.

TECHNICAL FIELD

The present disclosure relates to the field of display technologies and, in particular, to a pulse generation device, an array substrate, a display device, a drive circuit and a driving method.

BACKGROUND

A liquid display device includes a plurality of sub-pixel units defined by a plurality of data lines intersecting with a plurality of gate lines. The plurality of sub-pixel units is in a matrix distribution, each sub-pixel unit includes a pixel electrode and a thin film transistor. A source electrode of the thin film transistor is connected with the data line, a drain electrode of the thin film transistor is connected with the pixel electrode, a gate electrode of the thin film transistor is connected with the gate line, and the gate line is connected with a gate drive circuit. The gate drive circuit controls turn-on and turn-off of the thin film transistor through the gate line. When the thin film transistor is turned on, the data line provides a data voltage to its corresponding pixel electrode through the thin film transistor, so as to charge the corresponding pixel electrode. During a display process, for each sub-pixel unit, the polarity of the data voltage corresponding to the $N^{th}$ frame is opposite to the polarity of the data voltage corresponding to the $(N+1)^{th}$ frame. However, as the resolution increases, the turn-on time of the thin film transistor is shorter, which may cause the problem that voltage of the pixel electrode cannot reach a desired data voltage during the turn-on time of the thin film transistor, i.e., the problem of insufficient charge of the pixel electrode, thereby bringing adverse influence to the display effect.

SUMMARY

In view of the above, the embodiment of the present disclosure provide a pulse generation device, an array substrate, a display panel, a display device, a drive circuit and a driving method, which can solve the problem of insufficient charge of the pixel electrode, thereby improving display effect.

An aspect of the present disclosure provides a pulse generation device, including: a first input end; a second input end; a third input end; a pulse output end; a reset module, configured to, in response to a low level of the first input end, make the pulse output end output a low level; and the reset module is further configured to, in response to a low level of the second input end and a low level of the third input end, make the pulse output end output a low level; and a pulse generation module, configured to, in response to a high level of the first input end, a high level of the second input end and a low level of the third input end, make the pulse output end output a high level, the pulse generation module is further configured to, in response to a high level of the first input end, a low level of the second input end and a high level of the third input end, make the pulse output end output a high level.

Another aspect of the present disclosure provides a gate drive circuit, including: a first clock signal end; a second clock signal end; a pulse generation device; and a cascade multi-stage shift register; wherein each stage of the cascade multi-stage shift register includes a shift input end, an output end, a first signal end, a second signal end and a cascade signal end; the first signal end of an odd stage shift register is connected with the first clock signal end, and the second signal end of the odd stage shift register is connected with the second clock signal end; the first signal end of an even stage shift register is connected with the second clock signal end, and the second signal end of the even stage shift register is connected with the first clock signal end; except for a first stage shift register and an $n^{th}$ stage shift register, the shift input end of the shift register of each stage is connected with the cascade signal end of the shift register of an upper stage, wherein n is an integer greater than 2; the pulse generation device includes: a first input end; a second input end; a third input end; a pulse output end; a reset module, configured to, in response to a low level of the first input end, make the pulse output end output a low level, the reset module is further configured to, in response to a low level of the second input end and a low level of the third input end, make the pulse output end output a low level; and a pulse generation module, configured to, in response to a high level of the first input end, a high level of the second input end and a low level of the third input end, make the pulse output end output a high level, the pulse generation module is further configured to, in response to a high level of the first input end, a low level of the second input end and a high level of the third input end, make the pulse output end output a high level; wherein the second input end is connected with the cascade signal end of an $h^{th}$ stage shift register, h is a positive integer smaller than n−1, the third input end is connected with the cascade signal end of an $(n−1)^{th}$ stage shift register, the pulse output end is connected with the shift input end of an $n^{th}$ shift register; when n is an odd number, the first input end is connected with the first clock signal end; when n is an even number, the first input end is connected with the second clock signal end.

Another aspect of the present disclosure further provides an array substrate, including a gate drive circuit, wherein the gate drive circuit includes: a first clock signal end; a second clock signal end; a pulse generation device; and a cascade multi-stage shift register; wherein each stage of the cascade multi-stage shift register includes a shift input end, an output end, a first signal end, a second signal end and a cascade signal end; the first signal end of an odd stage shift register is connected with the first clock signal end, and the second signal end of the odd stage shift register is connected with the second clock signal end; the first signal end of an even stage shift register is connected with the second clock signal end, and the second signal end of the even stage shift register is connected with the first clock signal end; except for a first stage shift register and an $n^{th}$ stage shift register, the shift input end of the shift register of each stage is connected with the cascade signal end of the shift register of an upper stage, wherein n is an integer greater than 2; the pulse generation device includes: a first input end; a second input end; a third input end; a pulse output end; a reset module, configured to, in response to a low level of the first input end, make the pulse output end output a low level, the reset module is further configured to, in response to a low level of the second input end and a low level of the third input end, make the pulse output end output a low level; and a pulse generation module, configured to, in response to a high level of the first input end, a high level of the second input end and a low level of the third input end, make the pulse output end output a high level, the pulse generation module is further configured to, in response to a high level of the first input end, a low level of the second input end and a high level of the third input end, make the pulse output end output a high level; wherein the second input end is connected with the cascade signal end of an $h^{th}$ stage shift register, h is a positive integer smaller than n−1, the third input end is connected with the cascade signal end of an $(n−1)^{th}$ stage shift register, the pulse output end is connected with the shift input end of an $n^{th}$ shift register; when n is an odd number, the first input end is connected with the first clock signal end; when n is an even number, the first input end is connected with the second clock signal end.

Another aspect of the present disclosure further provides a display device, including an array substrate, wherein the array substrate includes a gate drive circuit, and the gate drive circuit includes: a first clock signal end; a second clock signal end; a pulse generation device; and a cascade multi-stage shift register; wherein each stage of the cascade multi-stage shift register includes a shift input end, an output end, a first signal end, a second signal end and a cascade signal end; the first signal end of an odd stage shift register is connected with the first clock signal end, and the second signal end of the odd stage shift register is connected with the second clock signal end; the first signal end of an even stage shift register is connected with the second clock signal end, and the second signal end of the even stage shift register is connected with the first clock signal end; except for a first stage shift register and an $n^{th}$ stage shift register, the shift input end of the shift register of each stage is connected with the cascade signal end of the shift register of an upper stage, wherein n is an integer greater than 2; the pulse generation device includes: a first input end; a second input end; a third input end; a pulse output end; a reset module, configured to, in response to a low level of the first input end, make the pulse output end output a low level, the reset module is further configured to, in response to a low level of the second input end and a low level of the third input end, make the pulse output end output a low level; and a pulse generation module, configured to, in response to a high level of the first input end, a high level of the second input end and a low level of the third input end, make the pulse output end output a high level, the pulse generation module is further configured to, in response to a high level of the first input end, a low level of the second input end and a high level of the third input end, make the pulse output end output a high level; wherein the second input end is connected with the cascade signal end of an $h^{th}$ stage shift register, h is a positive integer smaller than n−1, the third input end is connected with the cascade signal end of an $(n−1)^{th}$ stage shift register, the pulse output end is connected with the shift input end of an $n^{th}$ shift register; when n is an odd number, the first input end is connected with the first clock signal end; when n is an even number, the first input end is connected with the second clock signal end.

Another aspect of the present disclosure provides a driving method, applied to a gate drive circuit, the method includes: when an $i^{th}$ stage shift register outputs a high level, an $(i+j)^{th}$ stage shift register outputs a high level; when n is an even and h is an odd, i is selected from h+1, h+2, h+3 . . . , m1, wherein m1 is an integer greater than n; when n is an even and h is an even, i is selected from h, h+1, h+2 . . . , m2, wherein m2 is an integer greater than n; when n is an odd and h is an odd, i is selected from h, h+1, h+2 . . . , m3, wherein m3 is an integer greater than n; and when n is an odd and h is an even, i is selected from h−1, h, h+1 . . . , m4, wherein m4 is an integer greater than n; j is an integer greater than or equal to 2; wherein the gate drive circuit includes: a first clock signal end, a second clock signal end, a pulse generation device and a cascade multi-stage shift register; wherein each stage of the cascade multi-stage shift register includes a shift input end, an output end, a first signal end, a second signal end and a cascade signal end; the first signal end of an odd stage shift register is connected with the first clock signal end, and the second signal end of the odd stage shift register is connected with the second clock signal end; the first signal end of an even stage shift register is connected with the second clock signal end, and the second signal end of the even stage shift register is connected with the first clock signal end; except for a first stage shift register and an $n^{th}$ stage shift register, the shift input end of the shift register of each stage is connected with the cascade signal end of the shift register of an upper stage, wherein n is an integer greater than 2; the pulse generation device includes: a first input end; a second input end; a third input end; a pulse output end; a reset module, configured to make the pulse output end output a low level, in response to a low level of the first input end, the reset module is further configured to make the pulse output end output a low level, in response to a low level of the second input end and a low level of the third input end; and a pulse generation module, configured to make the pulse output end output a high level, in response to a high level of the first input end, a high level of the second input end and a low level of the third input end, the pulse generation module is further configured to make the pulse output end output a high level, in response to a high level of the first input end, a low level of the second input end and a high level of the third input end; wherein the second input end is connected with the cascade signal end of an $h^{th}$ stage shift register, h is a positive integer smaller than n−1, the third input end is connected with the cascade signal end of an $(n−1)^{th}$ stage shift register, the pulse output end is connected with the shift input end of an $n^{th}$ shift register, when n is an odd, the first input end is connected with the first clock signal end, when n is an even, the first input end is connected with the second clock signal end.

In the pulse generation device, the array substrate, the display panel, the display device, the drive circuit and the driving method according to the embodiments of the present disclosure, it is achieved that, when the $i^{th}$ row of pixel electrodes is being charged, the $(i+j)^{th}$ row of pixel electrodes is being pre-charged, that is, the $(i+j)^{th}$ row of pixel electrodes is charged under the voltage of the $i^{th}$ row of pixel electrodes during the pre-charging time of the $(i+j)^{th}$ row of pixel electrodes, and then charged under the voltage of the $(i+j)^{th}$ row of pixel electrodes during the charging time of the $(i+j)^{th}$ row of pixel electrodes, wherein j is an integer greater than or equal to 2. Comparing with the prior art, more charging time is provided for the pixel electrode, so that the problem of insufficient charge of the pixel electrode can be solved to a certain extent, thereby improving display effect. In addition, in the pre-charging manner of the prior art, the pre-charging time of a latter row is less than the charging time of a former row, as a result, after the voltage of the pixel electrodes in the former row is pulled down, the time for the voltage of the former row of pixel electrodes to be pulled up back to the data line voltage is short, which may readily cause the problem of insufficient charge of the pixel electrode. However, unlike pre-charging a latter row of pixel electrodes during the charging time of a former row of pixel electrodes, in the present disclosure, when the $i^{th}$ row of pixel electrodes is being charged, the $(i+j)^{th}$ row of pixel electrodes is being pre-charged, therefore, it can be set that the pre-charging time of the $(i+j)^{th}$ row of pixel electrodes equals to the charging time of the $i^{th}$ row of pixel electrodes, and the $(i+j)^{th}$ row of pixel electrodes starts to be pre-charged from the same stage when the $i^{th}$ row of pixel electrodes starts to be charged. Therefore, the $i^{th}$ row of pixel electrodes and the $(i+j)^{th}$ row of pixel electrodes reverse their polarities at the same time, so that the problem of insufficient charge of the pixel electrode in the prior art due to mutual influence between polarities of two pixel electrodes can be solved. That is, the pulse generation device, the array substrate, the display panel, the display device, the drive circuit and the driving method according to the embodiments of the present disclosure can increase charging time of the pixel electrode in any one of a row reversing manner, a column reversing manner as well as a point reversing manner.

BRIEF DESCRIPTION OF DRAWINGS

In order to more clearly illustrate technical solutions of embodiments of the present disclosure, the accompanying drawings used in the embodiments will be briefly introduced hereinafter. Obviously, the drawings described are merely some of the embodiments of the present disclosure, on the basis of these drawings, those of ordinary skill in the art can also obtain other drawings without creative efforts.

DESCRIPTION OF EMBODIMENTS

For better understanding of technical solutions of the present disclosure, embodiments of the present disclosure will be illustrated in detail with reference to the accompanying drawings.

It should be understood that, the described embodiments are only a part of the embodiments, rather than all of them. Based on the embodiments of the present disclosure, any other embodiments obtained by those of ordinary skill in the art shall fall in the protection scope of the present disclosure.

The terms used in the embodiments of the present disclosure are merely for the purpose of describing specific embodiments, rather than limiting the present disclosure. The singular form "a", "an", "the" and "said" used in the embodiments and claims shall be interpreted as also including the plural form, unless otherwise clearly noted in the context.

Figure 1:
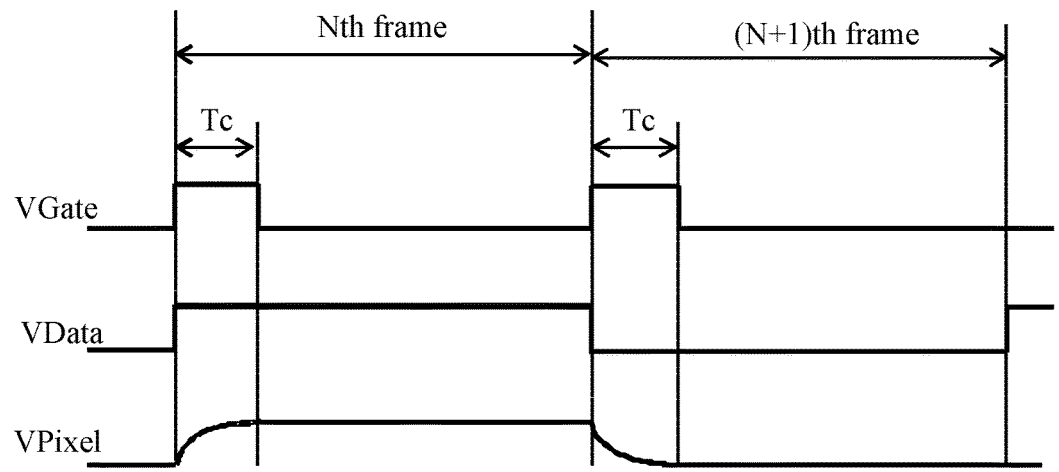
FIG. 1 illustrates a sequence diagram of a sub-pixel unit at an $N^{th}$ frame and an $(N+1)^{th}$ frame according to the prior art.

FIG. 1 illustrates a sequence diagram of a sub-pixel unit at the $N^{th}$ frame and the $(N+1)^{th}$ frame according to the prior art. As shown in FIG. 1, VGate is the gate line voltage of the sub-pixel unit, VData is the data line voltage of the sub-pixel unit, and VPixel is the pixel electrode voltage of the sub-pixel unit. When the gate line voltage VGate is a high level, the thin film transistor corresponding to the sub-pixel unit is turned on, at this moment, the sub-pixel unit is being charged; at the $N^{th}$ frame, the data line voltage VGate is a positive value during the charging time Tc, and the pixel electrode voltage VPixel gradually increases during the charging time Tc until the data line voltage VData is reached, then the pixel electrode voltage VPixel is maintained until the next charging process; at the $(N+1)^{th}$ frame, since the polarity of the pixel electrode is reversed, the data line voltage VDate is a negative value, and during the charging time Tc, the pixel electrode voltage VPixel gradually decreases from the positive value of the $N^{th}$ frame until the data line voltage VData is reached.

However, the above solution of the prior art may cause the problem of insufficient charge of the pixel electrode, thereby bringing adverse influence to the display effect.

Figure 2:
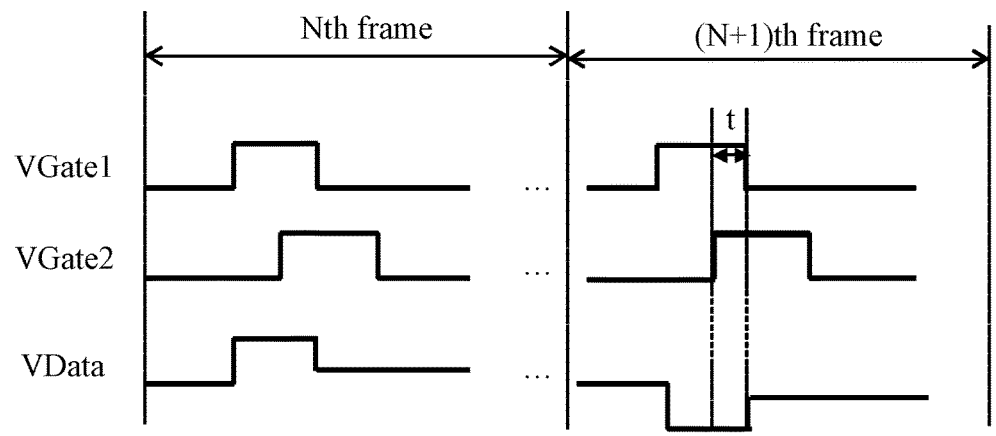
FIG. 2 illustrates a sequence diagram of two adjacent sub-pixel units located in a same column at an $N^{th}$ frame and an $(N+1)^{th}$ frame according to the prior art.

In order to solve the problem of insufficient charge of the pixel electrode, the prior art further provides a method for charging the pixel electrode in a pre-charging manner, as shown in FIG. 2, which illustrates a sequence diagram of two adjacent sub-pixel units located in a same column at an $N^{th}$ frame and an $(N+1)^{th}$ frame according to the prior art. In FIG. 2, VGate1 is a gate line voltage corresponding to a first row of sub-pixel units, VGate2 is a gate line voltage corresponding to a second row of sub-pixel units, VData is a data line voltage. When a turn-on state of a thin film transistor corresponding to the first row of sub-pixel units is about to stop, a thin film transistor corresponding to the second row of sub-pixel units is turned on, so that during the charging process of the first row of sub-pixel units, the second row of sub-pixel units is pre-charged, that is, the polarity of the second row of sub-pixel units is reversed in advance, which also means that the time for the polarity of the second row of sub-pixel units to be reversed is provided, thereby solving the problem of insufficient charge of the pixel electrode to a certain extent. However, in the pre-charging manner shown in FIG. 2, for example, at the end of the $N^{th}$ frame, the polarity of both the first and second rows of sub-pixel units is positive, and in the $(N+1)^{th}$ frame, before the pre-charging time t, the thin film transistor corresponding to the first row of sub-pixel units is turned on. Taking the first column of sub-pixel units as an example, the first column of data lines is conducted with the pixel electrode of the sub-pixel unit in the first row and the first column, so as to charge the sub-pixel unit, so that the polarity of the sub-pixel unit is reversed to a negative polarity and is charged to a desired voltage, at this moment, the pixel electrodes of the second row of sub-pixel units have positive polarity. When the pre-charging time t is started, both the thin film transistor corresponding to the first row of sub-pixel units and the thin film transistor corresponding to the second row of sub-pixel units are turned on, that is, the pixel electrode of the sub-pixel unit in the first row and the first column is electrically connected with the pixel electrode of the sub-pixel unit in the second row and the first column. Before the pixel electrodes of the second row of sub-pixel units are connected with the pixel electrodes of the first row of sub-pixel units, they have opposite polarities, as a result, after they are electrically connected, that is, when the pre-charging time t is started, the pixel electrode voltage of the sub-pixel unit in the first row and the first column will be pulled down by the negative voltage of the sub-pixel unit in the second row and the first column, thus, it is needed to pull up the pixel electrode voltage of the sub-pixel unit in the first row and the first column back to the charging voltage provided by the first row of data lines within the pre-charging time t. When the display resolution is high, the charging time of each row of sub-pixel units will be reduced, therefore, the pre-charging time t is reduced accordingly, which may cause that the pixel electrode voltage of the sub-pixel unit in the first row and the first column, after being pulled down, cannot recover to the desired voltage within the pre-charging time t, therefore, the problem of insufficient charge of the pixel electrode still exists. That is to say, the prior art cannot solve the problem of insufficient charge by the pre-charging manner for row reversing and point reversing.

Figure 3:
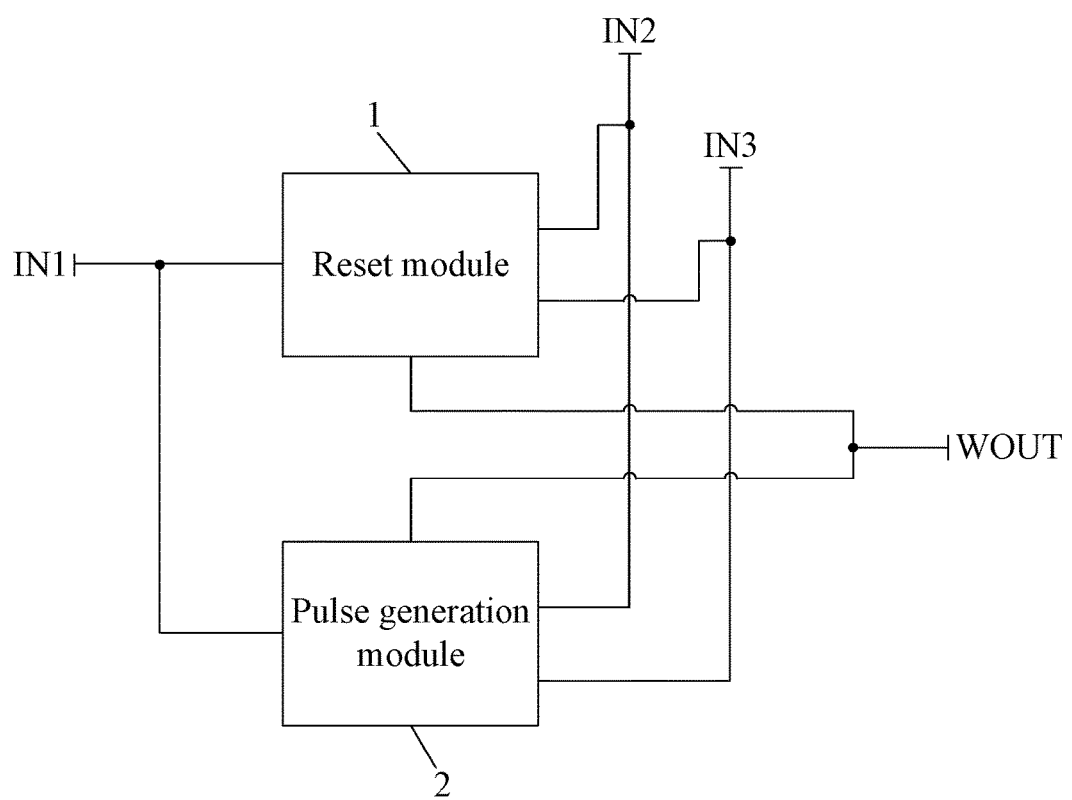
FIG. 3 illustrates a structural block diagram of a pulse generation device according to an embodiment of the present disclosure.

As shown in FIG. 3, which illustrates a structural block diagram of a pulse generation device according to an embodiment of the present disclosure. The pulse generation device includes: a first input end IN1, a second input end IN2, a third input end IN3 and a pulse output end WOUT; a reset module 1, configured to make the pulse output end WOUT output a low level, in response to a low level of the first input end IN1, the reset module 1 further configured to make the pulse output end WOUT output a low level, in response to a low level of the second input end IN2 and a low level of the third input end IN3; a pulse generation module 2, configured to make the pulse output end WOUT output a high level, in response to a high level of the first input end IN1, a high level of the second input end IN2 and a low level of the third input end IN3, the pulse generation module 2 further configured to make the pulse output end WOUT output a high level, in response to a high level of the first input end IN1, a low level of the second input end IN2 and a high level of the third input end IN3.

Figure 4:
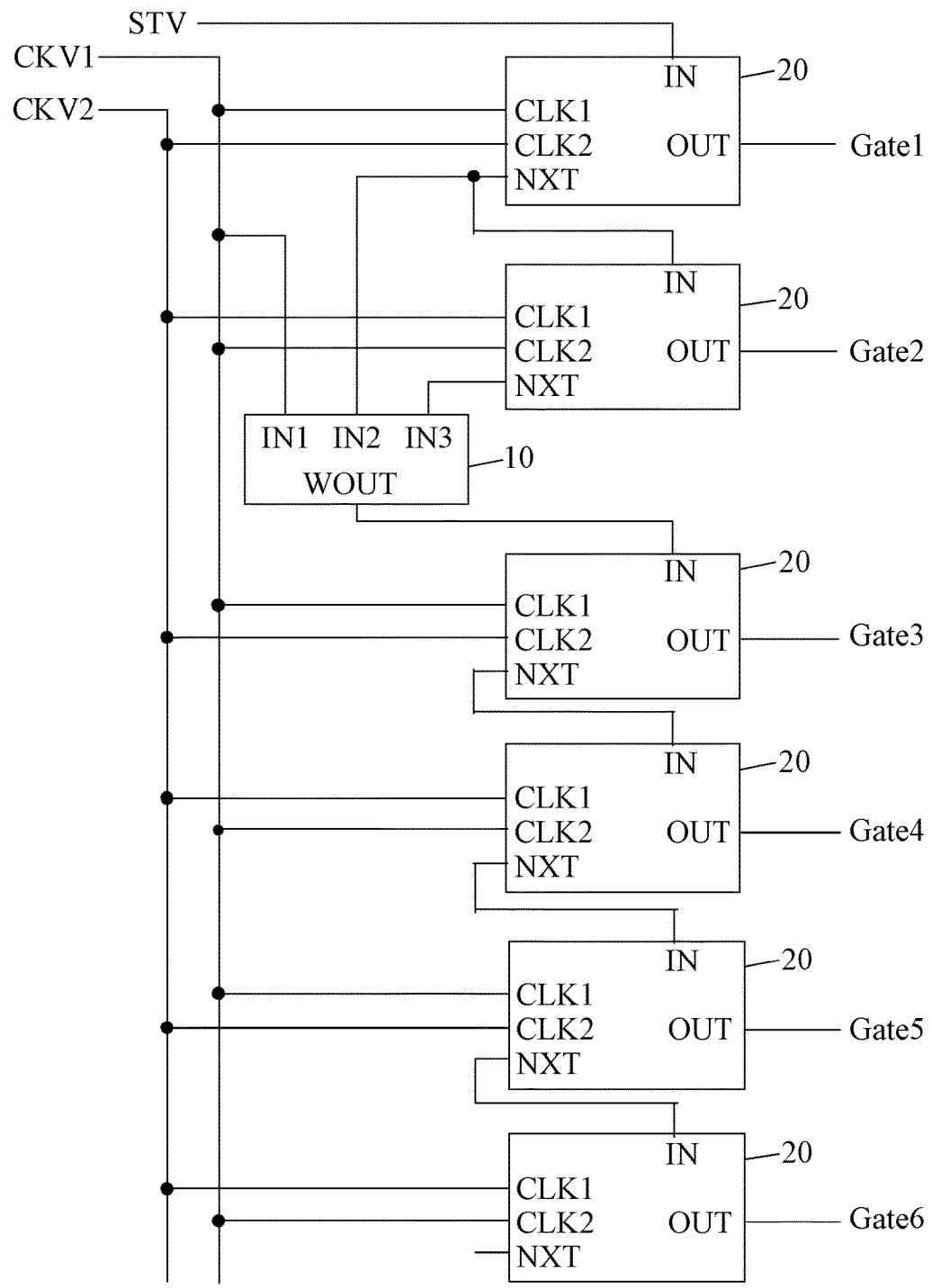
FIG. 4 illustrates a schematic circuit diagram of a gate drive circuit according to an embodiment of the present disclosure.
Figure 5:
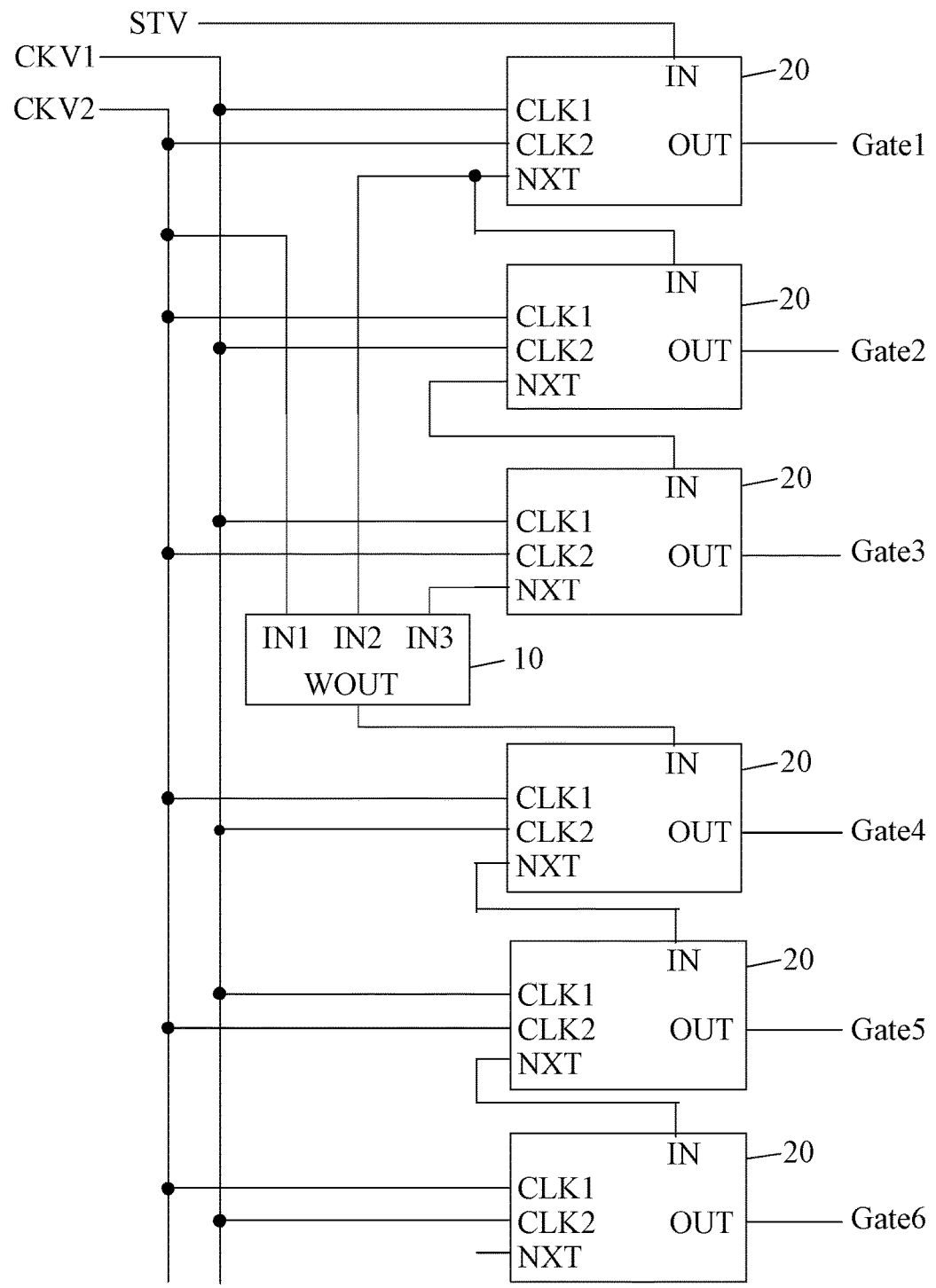
FIG. 5 illustrates a schematic circuit diagram of another gate drive circuit according to an embodiment of the present disclosure.

FIG. 4 illustrates a schematic circuit diagram of a gate drive circuit according to an embodiment of the present disclosure, FIG. 5 illustrates a schematic circuit diagram of another gate drive circuit according to an embodiment of the present disclosure. As shown in FIGS. 4-5, the gate drive circuit includes: a first clock signal end CKV1, a second clock signal end CKV2, a pulse generation device 10 and a cascade multi-stage shift register 20. Each stage of shift register 20 includes a shift input end IN, an output end OUT, a first signal end CLK1, a second signal end CLK2 and a cascade signal end NXT. A first signal end CLK1 of an odd stage shift register 20 is connected with the first clock signal end CKV1, a second signal end CLK2 of the odd stage shift register 20 is connected with the second clock signal end CKV2. A first signal end CLK1 of an even stage shift register 20 is connected with the second clock signal end CKV2, a second signal end CLK2 of the even stage shift register 20 is connected with the first clock signal end CKV1. Except for the first stage shift register 20 and the $n^{th}$ stage shift register 20, the shift input end IN of the shift register 20 of each stage is connected with the cascade signal end NXT of the shift register of one upper stage, n is an integer greater than 2. Combining FIG. 3 with FIG. 4 or FIG. 5, the pulse generation device 10 includes: a first input end IN1, a second input end IN2, a third input end IN3 and a pulse output end WOUT; a reset module 1, configured to make the pulse output end WOUT output a low level, in response to a low level of the first input end IN1; the reset module 1 further configured to make the pulse output end WOUT output a low level, in response to a low level of the second input end IN2 and a low level of the third input end IN3; a pulse generation module 2, configured to make the pulse output end WOUT output a high level, in response to a high level of the first input end IN1, a high level of the second input end IN2 and a low level of the third input end IN3; the pulse generation module 2 further configured to make the pulse output end WOUT output a high level, in response to a high level of the first input end IN1, a low level of the second input end IN2 and a high level of the third input end IN3; a shift input end IN of a first stage shift register 20 connected with an original signal end STV. For the pulse generation device 10, the second input end IN2 is connected with a cascade signal end NXT of the $h^{th}$ stage shift register 20, h is a positive integer smaller than n−1, the third input end IN3 is connected with the cascade signal end NXT of the $(n-1)^{th}$ stage shift register 20, the pulse output end WOUT is connected with a shift input end IN of the $n^{th}$ stage shift register 20. As shown in FIG. 4 when n is an odd number, the first input end IN1 is connected with the first clock signal end CKV1; as shown in FIG. 5, when n is an even number, the first input end IN1 is connected with the second clock signal end CKV2. In FIG. 4 and FIG. 5, the output ends OUT of the shift registers 20 of the stages are connected with gate lines of the $1^{st}$-$6^{th}$ rows (Gate 1-6), respectively. FIG. 4 shows a structure with h=1, n=3. FIG. 5 shows a structure with h=1, n=4.

Figure 6:
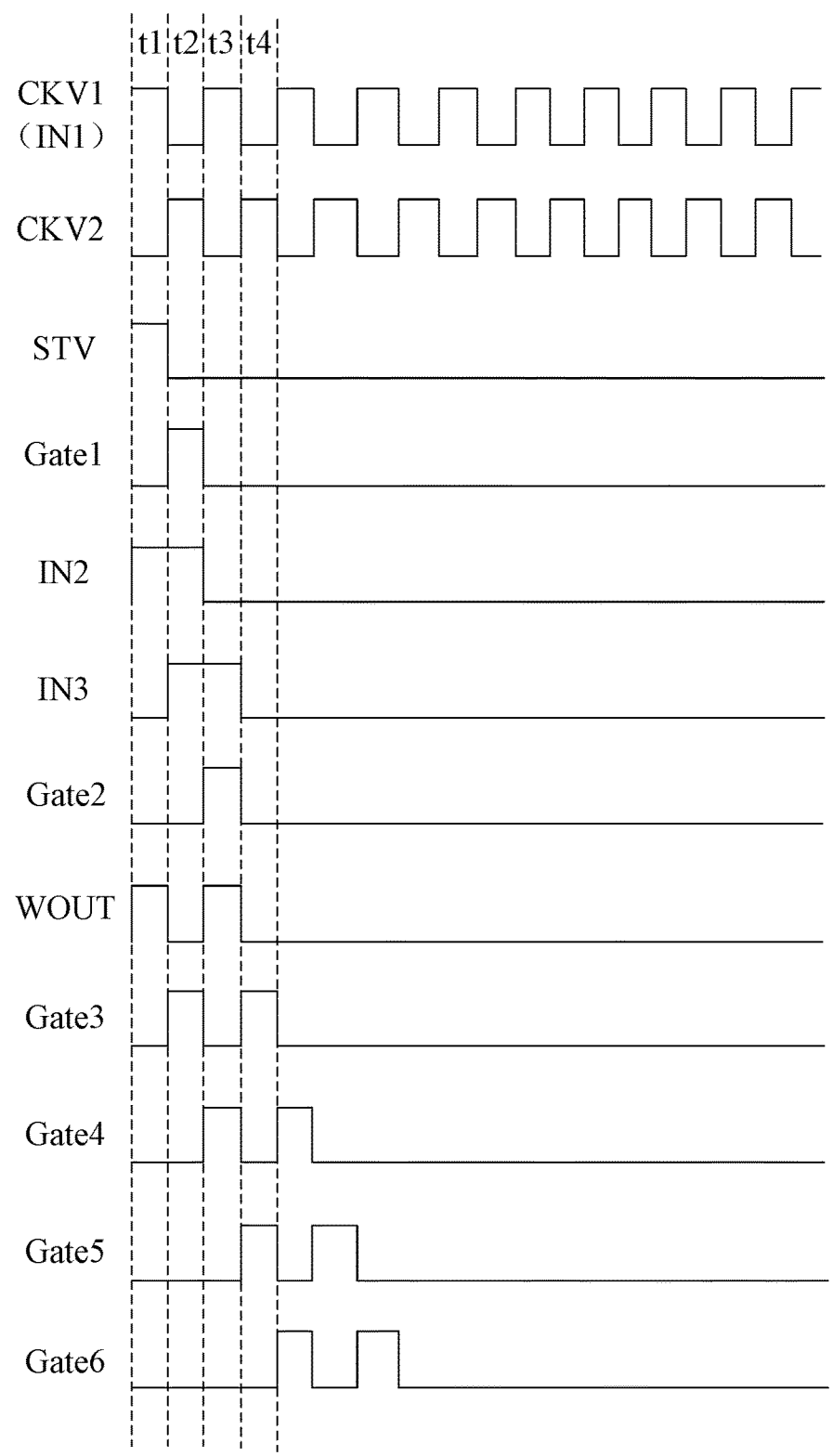
FIG. 6 illustrates a signal sequence diagram of ends of the gate drive circuit shown in FIG. 4.
Figure 7:
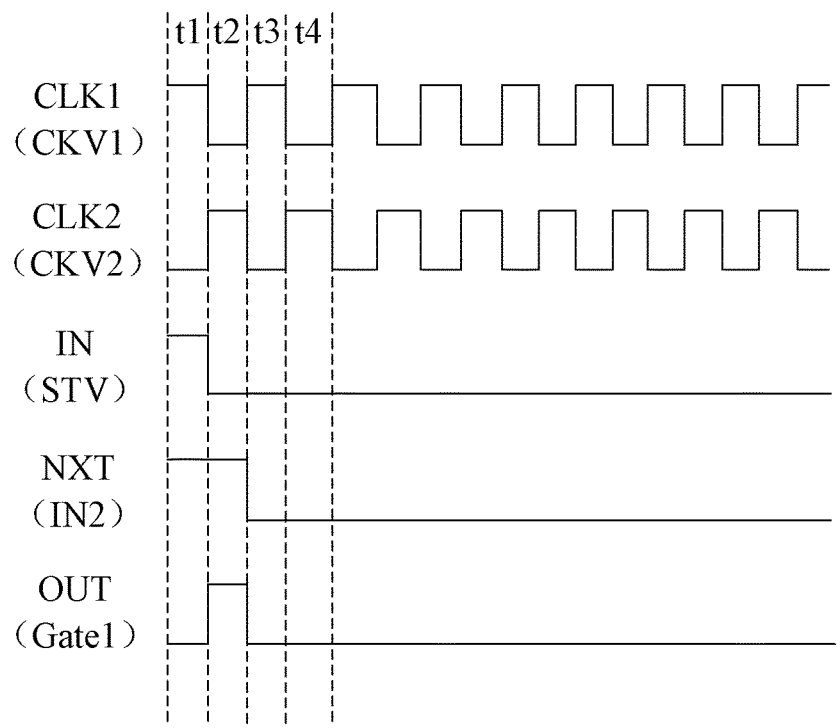
FIG. 7 illustrates a signal sequence diagram of ends of a first stage shift register shown in FIG. 4.
Figure 8:
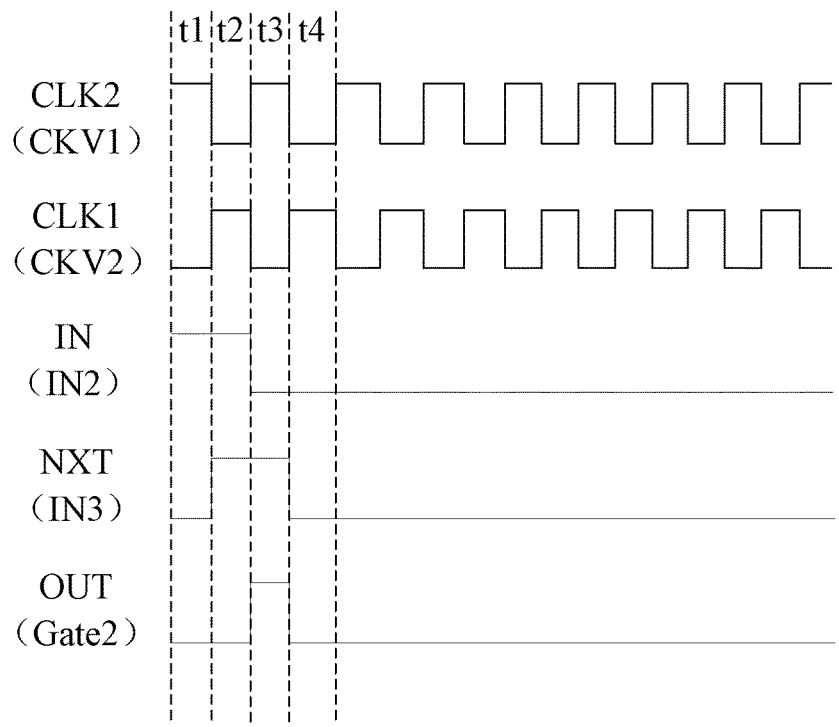
FIG. 8 illustrates a signal sequence diagram of ends of a second stage shift register shown in FIG. 4.
Figure 9:
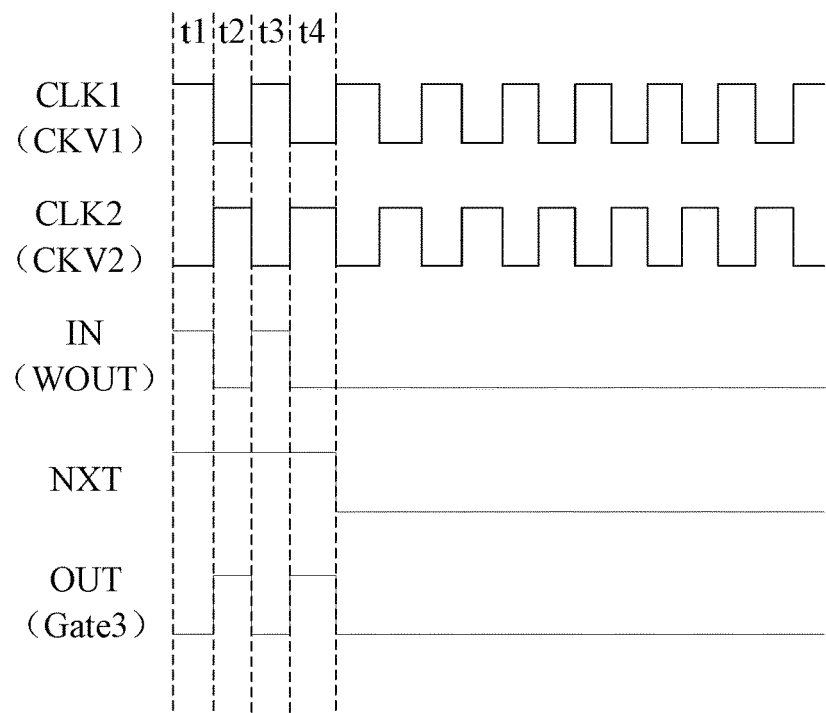
FIG. 9 illustrates a signal sequence diagram of ends of a third stage shift register shown in FIG. 4.
Figure 10:
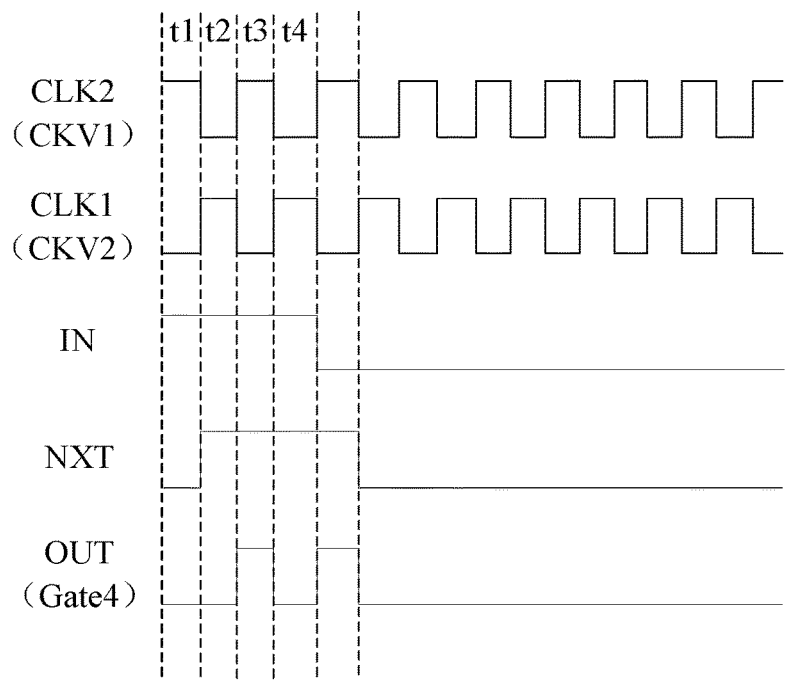
FIG. 10 illustrates a signal sequence diagram of ends of a fourth stage shift register shown in FIG. 4.

FIG. 3 and FIG. 4 will be taken as examples to illustrate the pulse generation device and the gate drive circuit in the embodiments of the present disclosure. As shown in FIG. 6, which illustrates a signal sequence diagram of ends of the gate drive circuit in FIG. 4. As shown in FIG. 6, the first clock signal end CKV1 and the second clock signal end CKV2 are configured to provide opposite clock signals. The original signal end STV is configured to provide a high level at the beginning of each frame, so as to trigger the shift function of the first stage shift register 20. FIG. 7 illustrates a signal sequence diagram of ends of a first stage shift register in FIG. 4. As shown in FIGS. 7-10, the signal sequence at each end of the first stage shift register 20 is not influenced by the pulse generation device 10, the cascade signal end NXT of the first stage shift register 20 outputs a signal to the second input end IN2 of the pulse generation device 10; FIG. 8 illustrates a signal sequence diagram of ends of a second stage shift register in FIG. 4, the signal sequence at each end of the second stage shift register 20 is not influenced by the pulse generation device 10, the cascade signal end NXT of the second stage shift register 20 outputs a signal to the third input end IN3 of the pulse generation device 10; FIG. 9 illustrates a signal sequence diagram of ends of a third stage shift register in FIG. 4, the pulse output end WOUT of the pulse generation device 10 outputs a signal to the shift input end IN of the third stage shift register 20, and according to the principle of the shift register 20, the shift register will output a high level at a next stage after the shift input end is a high level, therefore, the third stage shift register 20 outputs a high level at a second stage t2 and a fourth stage t4, in response to the high level output by the pulse output end WOUT of the pulse generation device 10 at a first stage t1 and a third stage t3, so as to achieve the function of the shift register. The high level output at the stage t2 is used for pre-charging the sub-pixel units corresponding to the gate line of the third row while the sub-pixel units corresponding to the gate line of the first row is being charged, the high level output at the stage t4 is used for charging the sub-pixel units corresponding to the gate line of the third row. FIG. 10 illustrates a signal sequence diagram of ends of a fourth stage shift register in FIG. 4, the fourth stage shift register 20 shifts the high level output by the output end OUT of the third stage shift register 20 in the high level period of the first signal end CLK1. The shift register 20 of each stage is configured to output a high level from the output end OUT at a next stage after a high level is input into the shift input end IN, and to output a high level from the cascade signal end NXT at a current stage when the high level is input into the shift input end IN and a followed next stage, so as to achieve the function of shifting. During the working process of the gate drive circuit, there exists periodical multiple frames, each frame includes multiple stages, and the present embodiment will be illustrated in detail through the working process of the shift register 20 and the gate drive circuit in the continuous first to fourth stages t1-t4 within a same frame:

As shown in FIG. 6, at the first stage t1, the first clock signal end CKV1 is a high level, the second clock signal end CKV2 is a low level, the original signal end STV is a high level, the level output by the first stage shift register 20 to the first gate line (Gate 1) is a low level, the second input end IN2 of the pulse generation device 10 is a high level, the third input end IN3 of the pulse generation device 10 is a low level, the pulse output end WOUT outputs a high level, all of the gate lines of the $2^{nd}$-$6^{th}$ rows (Gates 2-6) are low level; at the second stage t2, the first clock signal end CKV1 is a low level, the second clock signal end CKV2 is a high level, the original signal end STV is a low level, the level output by the first stage shift register 20 to the gate line of the first row (Gate 1) is a high level, at this moment, the pixel electrode corresponding to the gate line of the first row (Gate 1) is being charged, the gate line of the second row (Gate 2) is a low level, the second input end IN2 is a high level, the third input end IN3 is a high level, and thus, according to the principle of the pulse generation device 10, the pulse output end WOUT outputs a low level in response to the low level of the first input end IN1 (i.e., the first clock signal end CKV1); since the pulse output end WOUT is connected with the shift input end IN of the third stage shift register 20, the third stage shift register 20 outputs a high level to the gate line of the third row (Gate 3), at this moment, the pixel electrode corresponding to the gate line of the third row (Gate 3) is being pre-charged, the gate lines of the $3^{rd}$-$6^{th}$ rows (Gates 3-6) are all low level; at the third stage t3, the first clock signal end CKV1 is a high level, the second clock signal end CKV2 is a low level, the original signal end STV is a low level, the gate line of the first row (Gate 1) is a low level, the second input end IN2 is a low level, the third input end IN3 is a high level, the gate line of the second row (Gate 2) is a high level, at this moment, the pixel electrode corresponding to the gate line of the second row (Gate 2) is being charged, the gate line of the third row (Gate 3) is a low level, the gate line of the fourth row (Gate 4) is a high level, at this moment, the pixel electrode corresponding to the gate line of the fourth row (Gate 4) is being pre-charged, and both the gate line of the fifth row (Gate 5) and the gate line of the sixth row (Gate 6) are low level; at the fourth stage t4, the first clock signal end CKV1 is a low level, the second clock signal end CKV2 is a high level, the original signal end STV is a low level, the gate line of the first row (Gate 1) is a low level, the second input end IN2 is a low level, the third input end IN3 is a low level, the gate line of the second row (Gate 2) is a low level, the pulse output end WOUT outputs a low level in response to the low level of the first input end IN1 (i.e., the first clock signal end CKV1), and the gate line of the third row (Gate 3) is a high level, at this moment, the pixel electrode corresponding to the gate line of the third row (Gate 3) is being charged, meantime, the gate line of the fifth row (Gate 5) is a high level, the pixel electrode corresponding to the gate line of the fifth row (Gate 5) is being pre-charged, both the gate line of the fourth row (Gate 4) and the gate line of the sixth row (Gate 6) are low level. It can be seen that, when the pixel electrode corresponding to the gate line of the first row (Gate 1) is being charged, the pixel electrode corresponding to the gate line of the third row (Gate 3) is being pre-charged; when the pixel electrode corresponding to the gate line of the second row (Gate 2) is being charged, the pixel electrode corresponding to the gate line of the fourth row (Gate 4) is being pre-charged. Similarly, when the pixel electrode corresponding to the gate line of the $i^{th}$ row is being charged, the pixel electrode corresponding to the gate line of the $(i+j)^{th}$ row s is being pre-charged; when n is an even number and h is an odd number, i can be selected from h+1, h+2, h+3, . . . , m1, wherein m1 is an integer greater than n; when n is an even number and h is an even number, i can be selected from h, h+1, h+2, . . . , m2, wherein m2 is an integer greater than n; when n is an odd number and h is an odd number, i can be selected from h, h+1, h+2, . . . , m3, wherein m3 is an integer greater than n; when n is an odd number and h is an even number, i can be selected from h−1, h, h+1, . . . , m4, wherein m4 is an integer greater than n; j is an integer greater than or equal to 2, in the present embodiment, j=2 is taken as an example.

It should be understood that, in FIG. 4, only a structure with h=1 and n=3 is shown, that is, the second input end IN2 of the pulse generation device 10 is connected with the cascade signal end NXT of the first stage shift register 20, and the pulse output end WOUT of the pulse generation device 10 is connected with the shift input end IN of the third stage shift register 20. The structure with h=1 and n=3 is taken as an example to illustrate the working principles of the pulse generation device 10 and the gate drive circuit. In other possible implementing manners, the second input end IN2 can be connected with the cascade signal end NXT of the $h^{th}$ stage shift register, and the pulse output end WOUT can be connected with the shift input end IN of the shift register 20 of any other stage except for the $h^{th}$ stage and the $(h+1)^{th}$ stage. The working principles of the pulse generation device 10 and the gate drive circuit are similar, both of them can achieve that, when the $i^{th}$ stage shift register outputs a high level, the $(i+2)^{th}$ stage shift register outputs a high level, that is, when the pixel electrode corresponding to the gate line of the $i^{th}$ row s is being charged, the pixel electrode corresponding to the gate line of the $(i+2)^{th}$ row is being pre-charged. It should be noted that, under control of the pulse generation device 10, the $n^{th}$ stage shift register outputs an additional high level (pre-charging pulse signal), and outputs a high level (normal charging pulse signal) at a next stage after the $(n-1)^{th}$ shift register outputs a high level. The shift registers of the rest stages normally output a voltage to the gate lines based on their own functions. That is, starting from the gate line of the first row, at a next stage after the gate line of the $i^{th}$ row is a high level, the gate line of the $(i+1)^{th}$ row is a high level.

Figure 11:
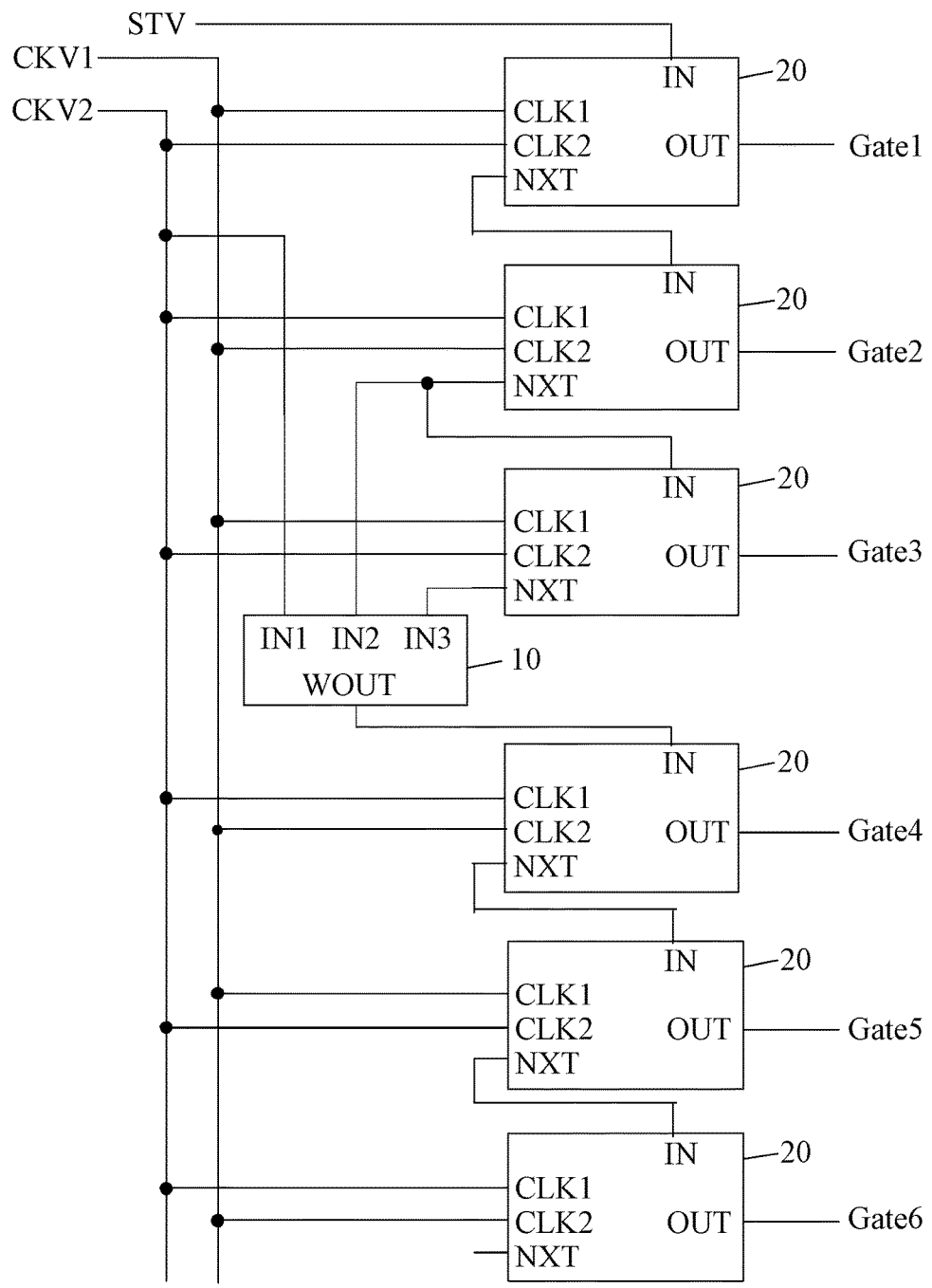
FIG. 11 illustrates a schematic circuit diagram of another gate drive circuit according to an embodiment of the present disclosure.
Figure 12:
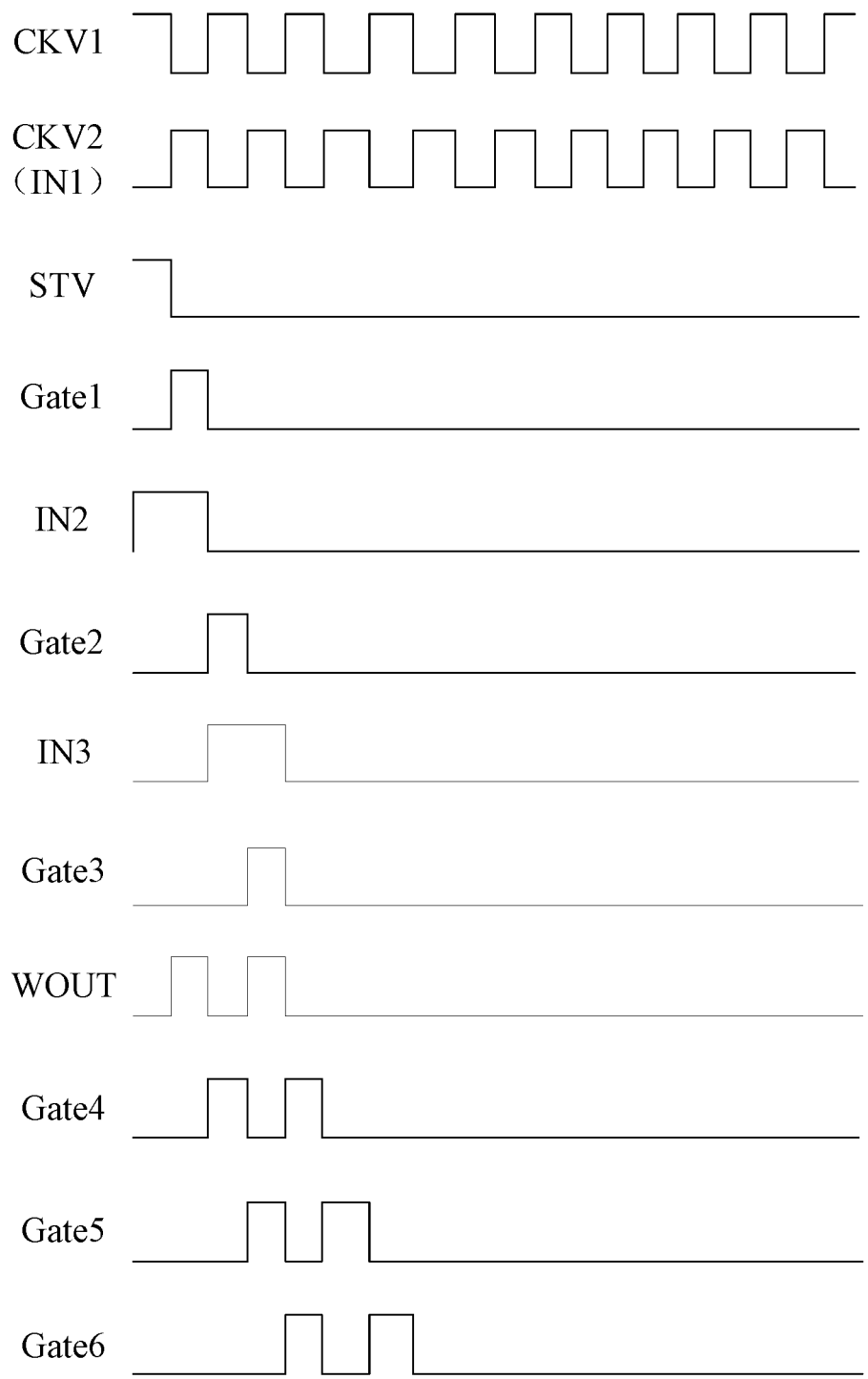
FIG. 12 illustrates a signal sequence diagram of ends of the gate drive circuit shown in FIG. 5 or FIG. 11.

As shown in FIG. 11 and FIG. 12, FIG. 11 illustrates a schematic circuit diagram of another gate drive circuit according to an embodiment of the present disclosure; FIG. 12 illustrates a signal sequence diagram of ends of the gate drive circuit in FIG. 5 or FIG. 11. When h=1 and n=4, or h=2 and n=4, starting from the gate line of the second row (Gate 2), when the pixel electrode corresponding to the gate line of the $i^{th}$ row is being charged, the pixel electrode corresponding to the gate line of the $(i+2)^{th}$ row is being pre-charged. That is, when n is an even number and h is an odd number, starting from the gate line of the $(h+1)^{th}$ row, when the pixel electrode corresponding to the gate line of the $i^{th}$ row is being charged, the pixel electrode corresponding to the gate line of the $(i+2)^{th}$ row is being pre-charged; when n is an even number and h is an even number, starting from the gate line of the $h^{th}$ row, when the pixel electrode corresponding to the gate line of the $i^{th}$ row is being charged, the pixel electrode corresponding to the gate line of the $(i+2)^{th}$ row is being pre-charged.

Figure 13:
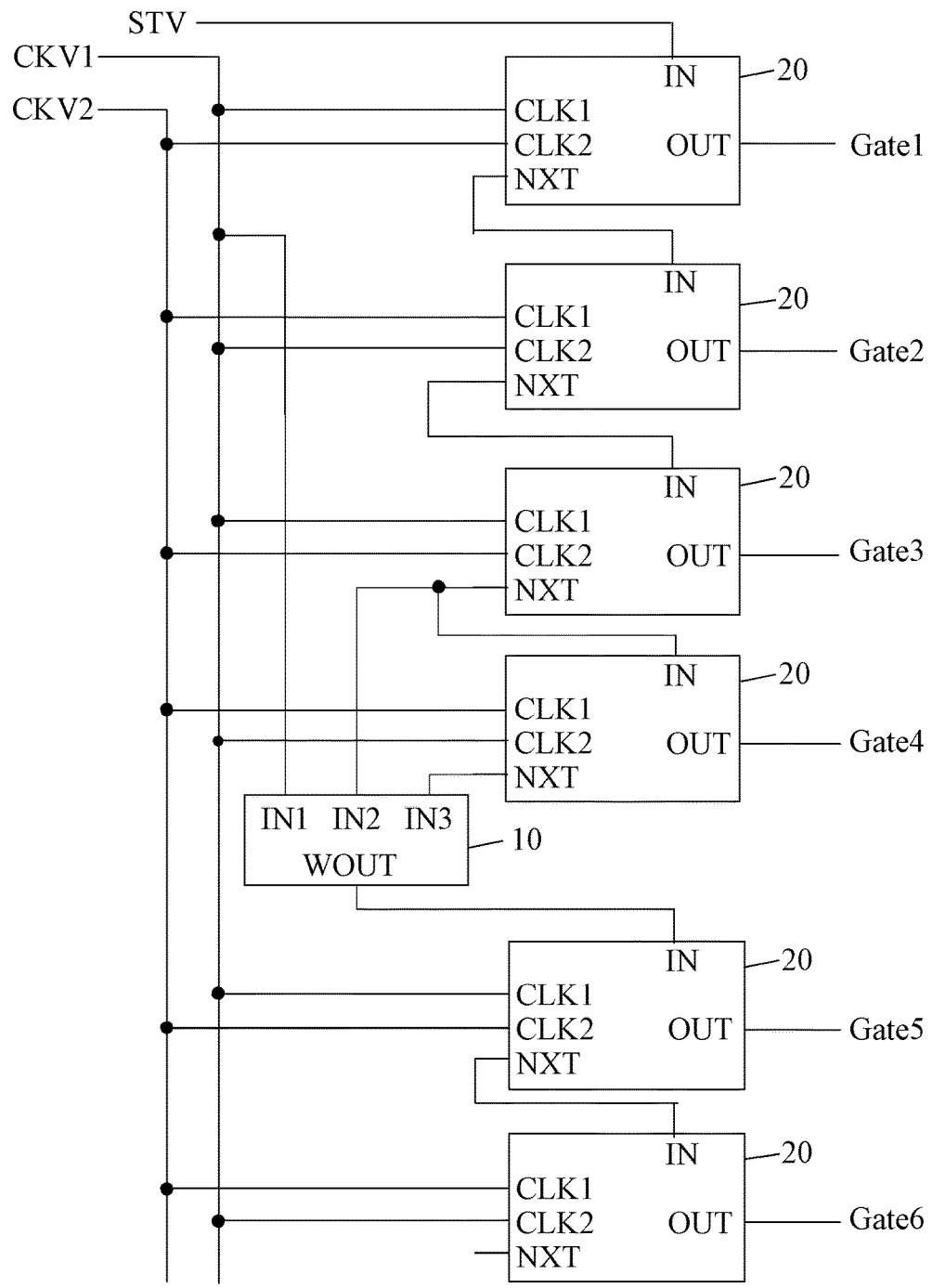
FIG. 13 illustrates a schematic circuit diagram of another gate drive circuit according to an embodiment of the present disclosure.
Figure 14:
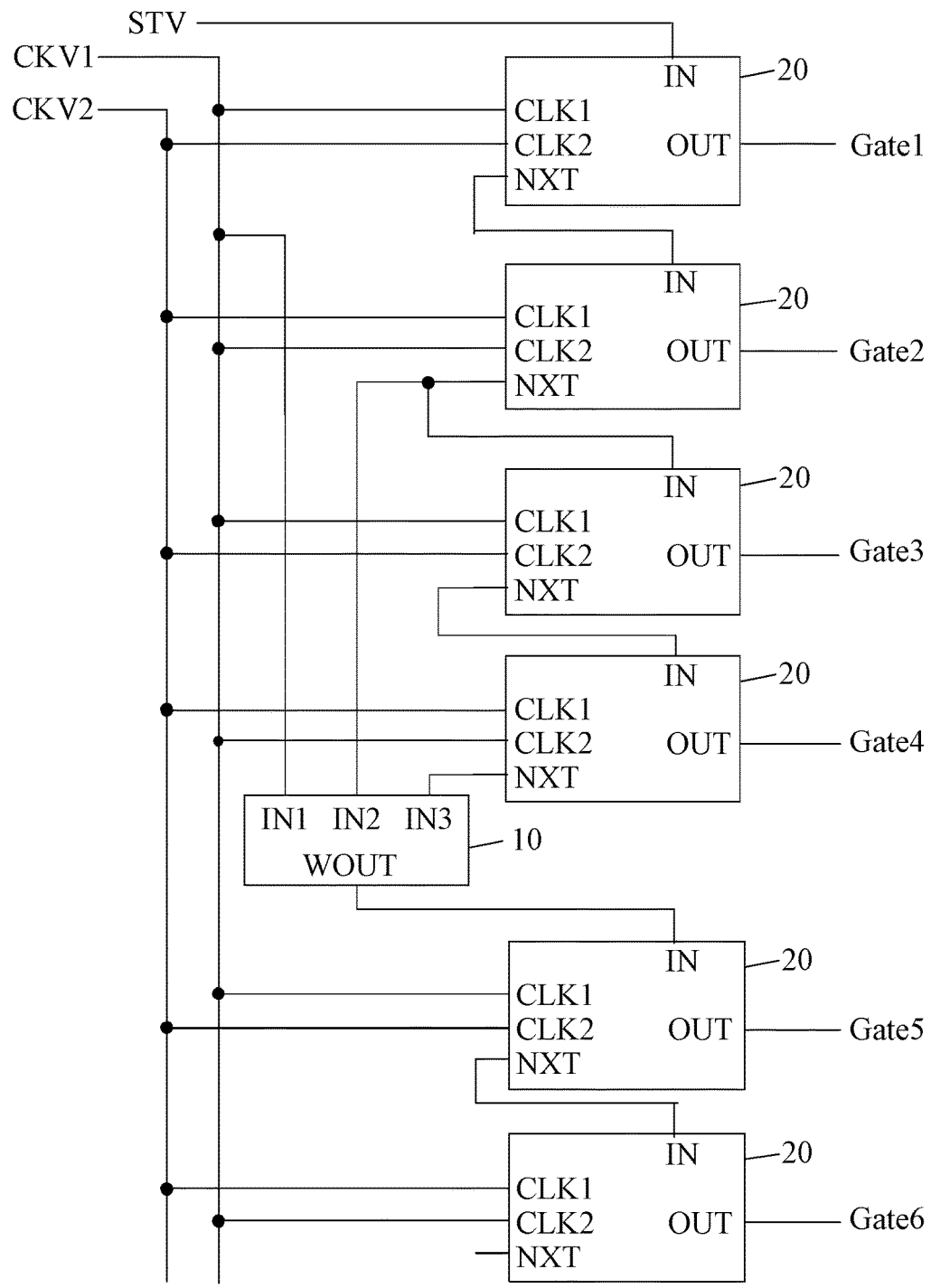
FIG. 14 illustrates a schematic circuit diagram of another gate drive circuit according to an embodiment of the present disclosure.
Figure 15:
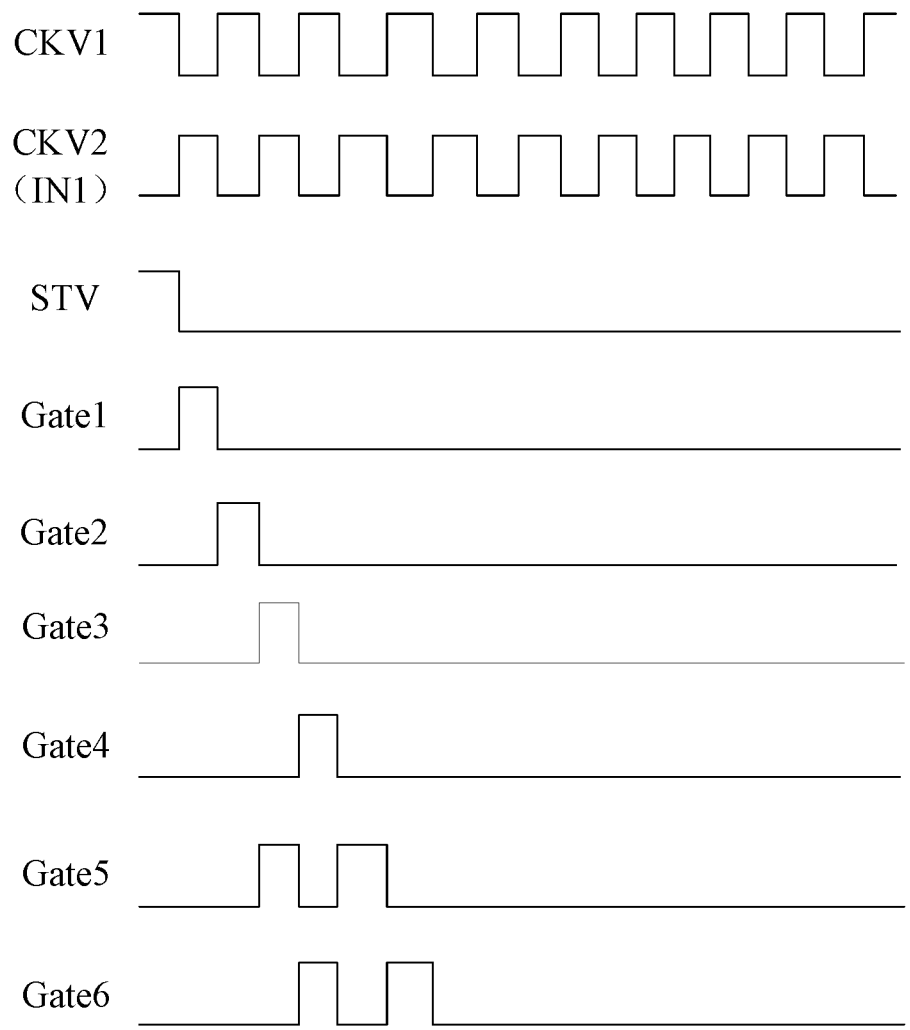
FIG. 15 illustrates a signal sequence diagram of ends of the gate drive circuit in FIG. 13 or FIG. 14.

As shown in FIG. 13, FIG. 14 and FIG. 15, FIG. 13 illustrates a schematic circuit diagram of another gate drive circuit according to an embodiment of the present disclosure, FIG. 14 illustrates a schematic circuit diagram of another gate drive circuit according to an embodiment of the present disclosure, and FIG. 15 illustrates a signal sequence diagram of ends of the gate drive circuit in FIG. 13 or FIG. 14. When h=3 and n=5, or h=4 and n=5, starting from the gate line of the third row (Gate 3), when the pixel electrode corresponding to the gate line of the $i^{th}$ row is being charged, the pixel electrode corresponding to the $(i+2)^{th}$ row of gate lines is being pre-charged. That is, when n is an odd number and h is an odd number, starting from the $h^{th}$ row, when the pixel electrode corresponding to the gate line of the $i^{th}$ row is being charged, the pixel electrode corresponding to the gate line of the $(i+2)^{th}$ row is being pre-charged; when n is an odd number and h is an even number, starting from the $(h-1)^{th}$ row, when the pixel electrode corresponding to the gate line of the $i^{th}$ row is being charged, the pixel electrode corresponding to the gate line of the $(i+2)^{th}$ row is being pre-charged.

In the pulse generation device and the gate drive circuit according to the embodiments of the present disclosure, it is achieved that when the $i^{th}$ row of pixel electrodes is being charged, the $(i+j)^{th}$ row of pixel electrodes is being pre-charged, that is, the $(i+j)^{th}$ row of pixel electrodes is charged under the voltage of the $i^{th}$ row of pixel electrodes during the pre-charging time of the $(i+j)^{th}$ row of pixel electrodes, and then charged under the voltage of the $(i+j)^{th}$ row of pixel electrodes during the charging time of the $(i+j)^{th}$ row of pixel electrodes, wherein j is an integer greater than or equal to 2. Comparing with the prior art, more charging time is provided for the pixel electrode, so that the problem of insufficient charge of the pixel electrode can be solved to a certain extent, thereby improving display effect. In addition, in the pre-charging manner of the prior art, the pre-charging time of a latter row is less than the charging time of a former row, as a result, after the voltage of the pixel electrodes in the former row is pulled down, the time for the voltage of the former row of pixel electrodes to be pulled up back to the data line voltage is short, which may readily cause the problem of insufficient charge of the pixel electrode. However, unlike pre-charging a latter row of pixel electrodes during the charging time of a former row of pixel electrodes, in the present disclosure, when the $i^{th}$ row of pixel electrodes is being charged, the $(i+j)^{th}$ row of pixel electrodes is being pre-charged, therefore, it can be set that the pre-charging time of the $(i+j)^{th}$ row of pixel electrodes equals to the charging time of the $i^{th}$ row of pixel electrodes, and the $(i+j)^{th}$ row of pixel electrodes starts to be pre-charged from the same stage when the $i^{th}$ row of pixel electrodes starts to be charged. Therefore, the $i^{th}$ row of pixel electrodes and the $(i+j)^{th}$ row of pixel electrodes reverse their polarities at the same time, so that the problem of insufficient charge of the pixel electrode in the prior art due to mutual influence between polarities of two pixel electrodes can be solved.

Figure 16:
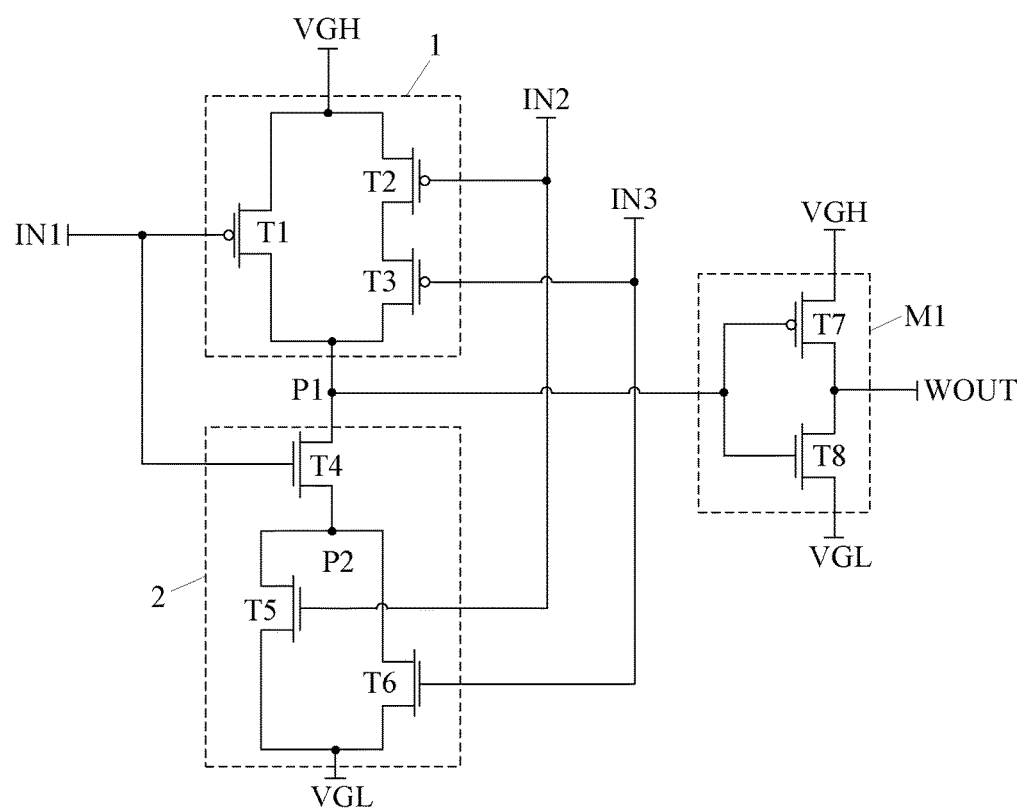
FIG. 16 illustrates a circuit diagram of a pulse generation device according to an embodiment of the present disclosure.

Optionally, FIG. 16 illustrates a circuit diagram of a pulse generation device according to an embodiment of the present disclosure. As shown in FIG. 16, the pulse generation device further includes a high level end VGH, a low level end VGL and a first inverter M1. The reset module 1 includes: a first transistor T1, a control end of the first transistor T1 is connected with the first input end IN1, a first end of the first transistor T1 is connected with the high level end VGH, a second end of the first transistor T1 is connected with a first node P1; a second transistor T2, a control end of the second transistor T2 is connected with the second input end IN2, a first end of the second transistor T2 is connected with the high level end VGH; a third transistor T3, a control end of the third transistor T3 is connected with the third input end IN3, a first end of the third transistor T3 is connected with a second end of the second transistor T2, a second end of the third transistor T3 is connected with the first node P1. The pulse generation module 2 includes: a fourth transistor T4, a control end of the fourth transistor T4 is connected with the first input end IN1, a first end of the fourth transistor T4 is connected with a second node P2, a second end of the fourth transistor T4 is connected with the first node P1; a fifth transistor T5, a control end of the fifth transistor T5 is connected with the second input end IN2, a first end of the fifth transistor T5 is connected with the low level end VGL, a second end of the fifth transistor T5 is connected with the second node P2; and a sixth transistor T6, a control end of the sixth transistor T6 is connected with the third input end IN3, a first end of the sixth transistor T6 is connected with the low level end VGL, a second end of the sixth transistor T6 is connected with the second node P2; an input end of the first inverter M1 is connected with the first node P1, and an output end of the first inverter M1 is connected with the pulse output end WOUT; the first transistor T1, the second transistor T2, the third transistor T3 are P type transistors, the fourth transistor T4, the fifth transistor T5 and the sixth transistor T6 are N type transistors.

Optionally, in the above pulse generation device and the gate drive circuit, the first inverter M1 includes: a seventh transistor T7, a control end of the seventh transistor T7 is connected with the first node P1, a first end of the seventh transistor T7 is connected with the high level end VGH, a second end of the seventh transistor T7 is connected with the pulse output end WOUT; and an eighth transistor T8, a control end of the eighth transistor T8 is connected with the first node P1, a first end of the eighth transistor T8 is connected with the low level end VGL, a second end of the eighth transistor T8 is connected with the pulse output end WOUT. The seventh transistor T7 is a P type transistor, and the eighth transistor T8 is an N type transistor.

The principle and working process of the pulse generation device shown in FIG. 16 will be illustrated with reference to the sequence shown in FIG. 6.

As shown in FIG. 6, at the first stage t1, the first input end IN1 is a high level, the first transistor T1 is turned off and the fourth transistor T4 is turned on, the second input end IN2 is a high level, the second transistor T2 is turned off and the fifth transistor T5 is turned on, so that the low level of the low level end VGL is transmitted to the first node P1 through the fourth transistor T4 and the fifth transistor T5, the low level of the first node P1 makes the pulse output end WOUT output a high level under action of the first inverter M1, the third input end IN3 is a low level, the third transistor T3 is turned on and the sixth transistor T6 is turned off; at the second stage t2, the first input end IN1 is a low level, the first transistor T1 is turned on and the fourth transistor T4 is turned off, the high level of the high level end VGH is transmitted to the first node P1 through the first transistor T1, the high level of the first node P1 makes the pulse output end WOUT output a low level under action of the first inverter M1, the second input end IN2 is a high level, the second transistor T2 is turned off and the fifth transistor T5 is turned on, the third input end IN 3 is a high level, the third transistor T3 is turned off and the sixth transistor T6 is turned on; at the stage t3, the first input end IN1 is a high level, the first transistor T1 is turned off and the fourth transistor T4 is turned on, the second input end IN2 is a low level, the second transistor T2 is turned on and the fifth transistor T5 is turned off, the third input end IN3 is a high level, the third transistor T3 is turned off and the sixth transistor T6 is turned on, so that the low level of the low level end VGL is transmitted to the first node P1 through the sixth transistor T6 and the fourth transistor T4, the low level of the first node P1 makes the pulse output end WOUT output a high level under action of the first inverter M1; at the stage t4, the first input end IN1 is a low level, the first transistor T1 is turned on and the fourth transistor T4 is turned off, the second input end IN2 is a low level, the second transistor T2 is turned on and the fifth transistor T5 is turned off, the third input end IN 3 is a low level, the third transistor T3 is turned on and the sixth transistor T6 is turned off, so that the high level of the high level end VGH is transmitted to the first node P1 through the first transistor T1, or the high level of the high level end VGH is transmitted to the first node P1 through the second transistor T2 and the third transistor T3, the high level of the first node P1 makes the pulse output end WOUT output a low level under action of the first inverter M1.

Figure 17:
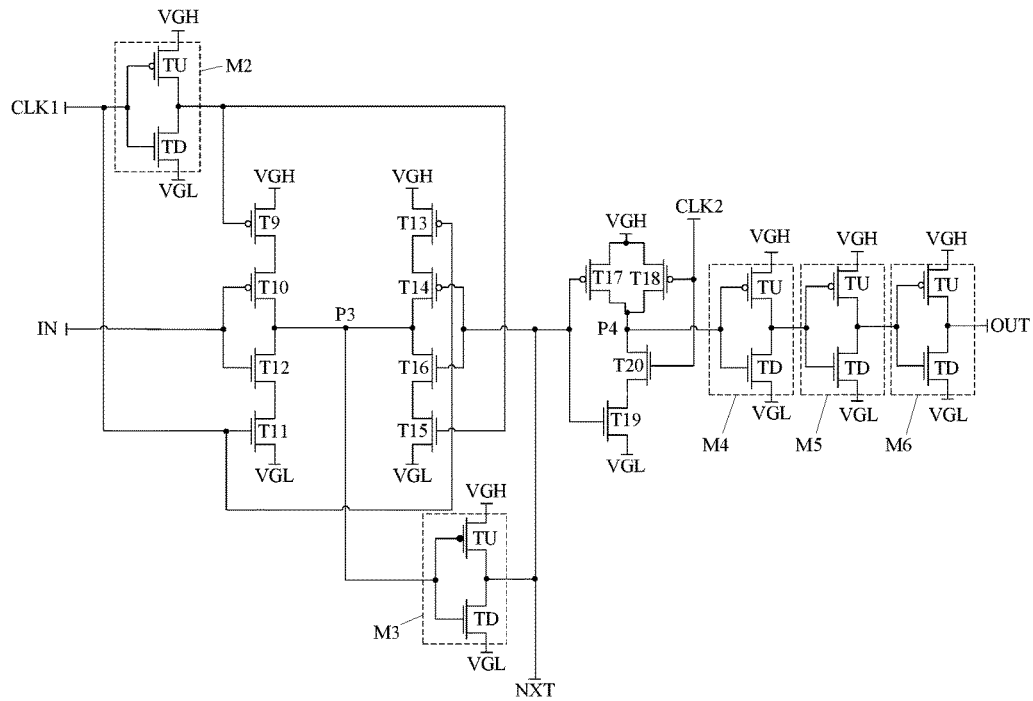
FIG. 17 illustrates a circuit diagram of a shift register according to an embodiment of the present disclosure.

Optionally, FIG. 17 illustrates a circuit diagram of a shift register according to an embodiment of the present disclosure. In the above gate drive circuit, as shown in FIG. 17, the shift register of each stage includes: a second inverter M2, an output end of the second inverter M2 is connected with the first signal end CLK1 of the shift register of the present stage; a ninth transistor T9, a control end of the ninth transistor T9 is connected with an output end of the second inverter M2, a first end of the ninth transistor T9 is connected with the high level end VGH; a tenth transistor T10, a control end of the tenth transistor T10 is connected with the shift input end IN of the shift register of the present stage, a first end of the tenth transistor T10 is connected with a second end of the ninth transistor T9, a second end of the tenth transistor T10 is connected with a third node P3; an eleventh transistor T11, a control end of the eleventh transistor T11 is connected with the first signal end CLK1, a first end of the eleventh transistor T11 is connected with the low level end VGL; a twelfth transistor T12, a control end of the twelfth transistor T12 is connected with the shift input end IN of the shift register of the present stage, a first end of the twelfth transistor T12 is connected with a second end of the eleventh transistor T11, a second end of the twelfth transistor T12 is connected with the third node P3; a third inverter M3, an input end of the third inverter M3 is connected with the third node P3, an output end of the third inverter M3 is connected with the cascade signal end NXT of the shift register of the present stage; a thirteenth transistor T13, a control end of the thirteenth transistor T13 is connected with the first signal end CLK1, a first end of the thirteenth transistor T13 is connected with the high level end VGH; a fourteenth transistor T14, a control end of the fourteenth transistor T14 is connected with the cascade signal end NXT of the shift register of the present stage, a first end of the fourteenth transistor T14 is connected with a second end of the thirteenth transistor T13, a second end of the fourteenth transistor T14 is connected with the third node P3; a fifteenth transistor T15, a control end of the fifteenth transistor T15 is connected with the output end of the second inverter M2, a first end of the fifteenth transistor T15 is connected with the low level end VGL; a sixteenth transistor T16, a control end of the sixteenth transistor T16 is connected with the cascade signal end NXT of the shift register of the present stage, a first end of the sixteenth transistor T16 is connected with a second end of the fifteenth transistor T15, a second end of the sixteenth transistor T16 is connected with the third node P3; a seventeenth transistor T17, a control end of the seventeenth transistor T17 is connected with the cascade signal end NXT of the shift register of the present stage, a first end of the seventeenth transistor T17 is connected with the high level end VGH, a second end of the seventeenth transistor T17 is connected with a fourth node P4; an eighteenth transistor T18, a control end of the eighteenth transistor T18 is connected with the second signal end CLK2, a first end of the eighteenth transistor T18 is connected with the high level end VGH, a second end of the eighteenth transistor T18 is connected with the fourth node P4; a nineteenth transistor T19, a control end of the nineteenth transistor T19 is connected with the cascade signal end NXT of the shift register of the present stage, a first end of the nineteenth transistor T19 is connected with the low level end VGL; and a twentieth transistor T20, a control end of the twentieth transistor T20 is connected with the second signal end CLK2, a first end of the twentieths transistor T20 is connected with a second end of the nineteenth transistor T19, a second end of the twentieths transistor T20 is connected with the fourth node P4. The fourth node P4 is connected with the output end OUT of the shift register of the present stage through a fourth inverter M4, a fifth inverter M5 and a sixth inverter M6 which are connected in series. The ninth transistor T9, the tenth transistor T10, the thirteenth transistor T13, the fourteenth transistor T14, the seventeenth transistor T17 and the eighteenth transistor T18 are P type transistors, the eleventh transistor T11, the twelfth transistor T12, the fifteenth transistor T15, the sixteenth transistor T16, the nineteenth transistor T19 and the twentieth transistor T20 are N type transistors.

Optionally, each of the second inverter M2, the third inverter M3, the fourth inverter M4, the fifth inverter M5 and the sixth inverter M6 includes: a pull-up transistor TU, a control end of the pull-up transistor TU is connected with an input end of the present inverter, a first end of the pull-up transistor TU is connected with the high level end VGH, a second end of the pull-up transistor TU is connected with an output end of the present inverter; a pull-down transistor PD, a control end of the pull-down transistor PD is connected with the input end of the present inverter, a first end of the pull-down transistor PD is connected with the low level end VGL, a second end of the pull-down transistor PD is connected with the output end of the present inverter. The pull-up transistor TU is a P type transistor, the pull-down transistor PD is an N type transistor.

Optionally, the smaller the value of h, the more the rows that can be pre-charged, which facilitates to improve the display effect, therefore, h can be set as h=1.

Optionally, the smaller the difference between the n and h, the shorter the time interval between the pre-charging pulse and the charging pulse in a same row of sub-pixel units, so that the sub-pixel units can be more quickly charged to a currently desired voltage from the voltage of the previous frame, which facilitates to improve the display effect, therefore, when h=1, n can be set as n=3.

The principle and working process of the shift register shown in FIG. 17 will be illustrated with reference to the signal sequence shown in FIG. 9, by taking the third stage shift register shown in FIG. 4 as an example:

As shown in FIG. 9 and FIG. 17, at the stage t1, the first signal end CLK1 is a high level, the second signal end CLK2 is a low level, the shift input end IN is a high level, the eleventh transistor T11 and the twelfth transistor T12 are turned on, the low level of the low level end VGL is transmitted to the third node P3 through the eleventh transistor T11 and the twelfth transistor T12, the low level of the third node P3 makes the cascade signal end NXT be a high level under action of the third inverter M3, the eighteenth transistor T18 is turned on, the high level of the high level end VGH is transmitted to the fourth node P4 through the eighteenth transistor T18, the high level of the fourth node P4 makes the output end OUT of the shift register of the present stage output a low level under action of the fourth inverter M4, the fifth inverter M5 and the sixth inverter M6; at the stage t2, the first signal end CLK1 is a low level, the second signal end CLK2 is a high level, the shift input end IN is a low level, the second inverter M2 outputs a high level, the ninth transistor T9 is turned off, the tenth transistor T10 is turned on, the eleventh transistor T11 and the twelfth transistor T12 are turned off, therefore, the third node P3 will not acquire a new voltage, but maintain the low level of the previous stage, the low level of the third node P3 makes the cascade signal end NXT be a high level under action of the third inverter M3, since the fifteenth transistor T15 and the sixteenth transistor T16 are turned on, then the low level of the low level end VGL is transmitted to the third node P3 through the fifteenth transistor T15 and the sixteenth transistor T16, so as to further supply the low level of the third node P3, the nineteenth transistor T19 and the twentieth transistor T20 are turned on, then the low level of the low level end VGL is transmitted to the fourth node P4 through the nineteenth transistor T19 and the twentieth transistor T20, the low level of the fourth node P4 makes the output end OUT of the shift register of the present stage output high level under action of the fourth inverter M4, the fifth inverter M5 and the sixth inverter M6; at the stage t3, the first signal end CLK1 is a high level, the second signal end CLK2 is a low level, the shift input end IN is a high level, similar to the stage t1, the cascade signal end NXT is a high level, the output end OUT of the shift register of the present stage outputs a low level; at the stage t4, the first signal end CLK1 is a low level, the second signal end CLK2 is a high level, the shift input end IN is a low level, similar to the stage t2, the cascade signal end NXT is a high level, the output end OUT of the shift register of the present stage outputs a high level.

It should be noted that, the principles of the shift registers of other stages is similar to the principle of the third stage shift register, the difference lies in that the sequence signals at ends of shift registers of different stages are different, therefore, the working process of registers of other stages will not be repeated herein. In addition, in order to provide an original signal to the first stage shift register 20 in FIG. 4, the above gate drive circuit can further include a dummy shift register (not shown in the figure), a cascade signal end of the dummy shift register serves as an original signal end STV, the dummy shift register does not have the function of shifting, but only provides an original signal to the first stage shift register 20. Moreover, in the transistors of the embodiments of the present disclosure, the control end is a gate electrode of the transistor, the first end is a source electrode of the transistor, and the second end is a drain electrode of the transistor. It should be noted that, in the thin film transistor, the source electrode is not be explicitly distinguished from the drain electrode, as a result, the first end can also be a drain electrode of the transistor, and the second end can also be a source electrode of the transistor.

An embodiment of the present disclosure further provides an array substrate, including the above gate drive circuit. The array substrate includes a plurality of sub-pixel units defined by a plurality of data lines intersecting with a plurality of gate lines. The plurality of sub-pixel units is in a matrix distribution, each sub-pixel unit includes a pixel electrode and a thin film transistor. A source electrode of the thin film transistor is connected with the data line, a drain electrode of the thin film transistor is connected with the pixel electrode, a gate electrode of the thin film transistor is connected with the gate line. In the above gate drive circuit, the output ends OUT of the shift registers of multiple stages are respectively connected with a plurality of rows of gate lines. The gate lines are configured to transmit control signals of the thin film transistors, the data lines are configured to transmit pixel voltage signals needed by the pixel electrodes. When the array substrate is working, under control of the corresponding gate lines, the data line corresponding to the source electrode charges/discharges to the pixel electrode corresponding to the drain electrode through the thin film transistor, and the pixel electrode and the common electrode form an electric field therebetween, so as to achieve display function.

The specific configuration and principle of the gate drive circuit are the same as described in the above embodiments, which will not be repeated herein.

In the array substrate according to the embodiments of the present disclosure, it is achieved that when the $i^{th}$ row of pixel electrodes is being charged, the $(i+j)^{th}$ row of pixel electrodes is being pre-charged, that is, the $(i+j)^{th}$ row of pixel electrodes is pre-charged under the voltage of the $i^{th}$ row of pixel electrodes during the pre-charging time of the $(i+j)^{th}$ row of pixel electrodes, and then the $(i+j)^{th}$ row of pixel electrodes is charged under the voltage of the $(i+j)^{th}$ row of pixel electrodes during the charging time of the $(i+j)^{th}$ row of pixel electrodes, j is an integer greater than or equal to 2. Comparing with the prior art, more charging time is provided for the pixel electrode, so that the problem of insufficient charge of the pixel electrode can be solved to a certain extent, thereby improving display effect. In addition, in the pre-charging manner of the prior art, the pre-charging time of a latter row is less than the pre-charging time of a former row, as a result, after the voltage of the pixel electrodes in the former row is pulled down, the time for the voltage of the pixel electrodes to be pulled up back to the data line voltage is short, which may readily cause the problem of insufficient charge of the pixel electrode. However, in the present disclosure, the pre-charging time of the $(i+j)^{th}$ row of pixel electrodes equals to the charging time of the $i^{th}$ row of pixel electrodes. Therefore, the voltage of the $i^{th}$ row of pixel electrodes, after being pulled down, can be pulled up back to the data line voltage within a relative long period of time, so that the problem of insufficient charge of the pixel electrode does not readily occur.

Figure 18:
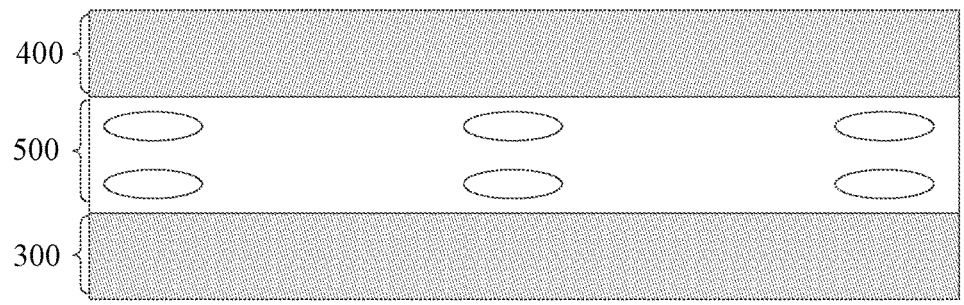
FIG. 18 illustrates a structural schematic diagram of a display panel according to an embodiment of the present disclosure.

FIG. 18 illustrates a schematic structural diagram of a display panel according to an embodiment of the present disclosure. As shown in FIG. 18, the display panel includes the array substrate 300 as above, a color film substrate 400 arranged opposite to the array substrate 300, and a liquid crystal layer 500 arranged between the array substrate 300 and the color film substrate 400. When the display panel is displaying, the pixel electrode of the array substrate 300 and the common electrode form an electric field therebetween, so as to control rotation of the liquid molecules in the liquid crystal layer 500, so as to achieve display function.

The specific configuration and principle of the array substrate 300 are the same as described in the above embodiments, which will not be repeated herein.

In the display panel according to the embodiments of the present disclosure, it is achieved that, when the $i^{th}$ row of pixel electrodes is being charged, the $(i+j)^{th}$ row of pixel electrodes is being pre-charged, that is, the $(i+j)^{th}$ row of pixel electrodes is charged under the voltage of the $i^{th}$ row of pixel electrodes during the pre-charging time of the $(i+j)^{th}$ row of pixel electrodes, and then charged under the voltage of the $(i+j)^{th}$ row of pixel electrodes during the charging time of the $(i+j)^{th}$ row of pixel electrodes, wherein j is an integer greater than or equal to 2. Comparing with the prior art, more charging time is provided for the pixel electrode, so that the problem of insufficient charge of the pixel electrode can be solved to a certain extent, thereby improving display effect. In addition, in the pre-charging manner of the prior art, the pre-charging time of a latter row is less than the charging time of a former row, as a result, after the voltage of the pixel electrodes in the former row is pulled down, the time for the voltage of the former row of pixel electrodes to be pulled up back to the data line voltage is short, which may readily cause the problem of insufficient charge of the pixel electrode. However, unlike pre-charging a latter row of pixel electrodes during the charging time of a former row of pixel electrodes, in the present disclosure, when the $i^{th}$ row of pixel electrodes is being charged, the $(i+j)^{th}$ row of pixel electrodes is being pre-charged, therefore, it can be set that the pre-charging time of the $(i+j)^{th}$ row of pixel electrodes equals to the charging time of the $i^{th}$ row of pixel electrodes, and the $(i+j)^{th}$ row of pixel electrodes starts to be pre-charged from the same stage when the $i^{th}$ row of pixel electrodes starts to be charged. Therefore, the $i^{th}$ row of pixel electrodes and the $(i+j)^{th}$ row of pixel electrodes reverse their polarities at the same time, so that the problem of insufficient charge of the pixel electrode in the prior art due to mutual influence between polarities of two pixel electrodes can be solved.

Figure 19:
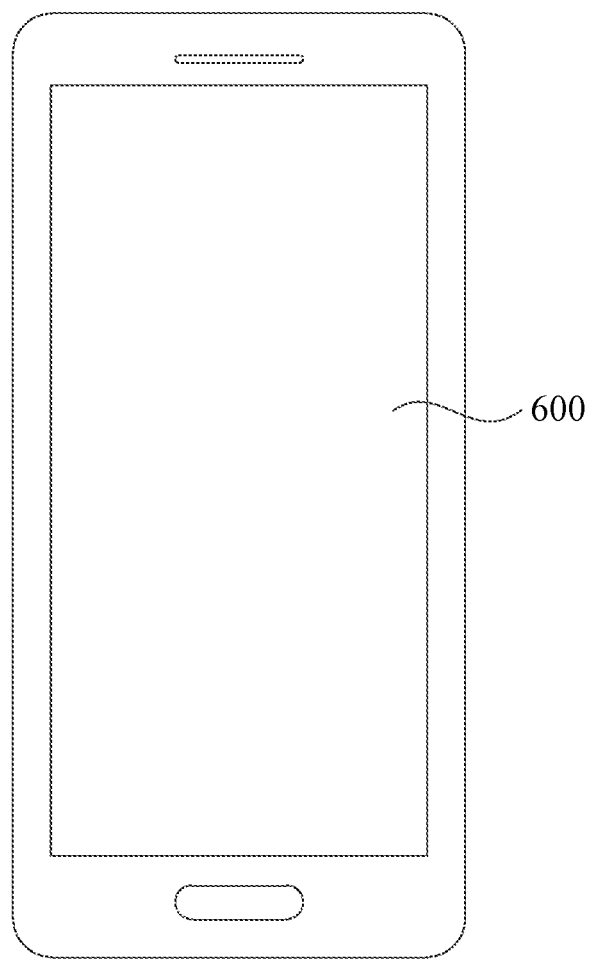
FIG. 19 illustrates a structural schematic diagram of a display device according to an embodiment of the present disclosure.

FIG. 19 illustrates a schematic structural diagram of a display device according to an embodiment of the present disclosure. As shown in FIG. 19, the display device includes the display panel 600 as above, and the display panel 600 includes the array substrate 300 as above.

The specific configuration and principle of the display panel 600 are the same as described in the above embodiments, which will not be repeated herein. The display device can be an electric device having display function, such as touch display screen, cellphone, tablet PC, laptop, e-book or television etc.

In the display device according to the embodiments of the present disclosure, it is achieved that, when the $i^{th}$ row of pixel electrodes is being charged, the $(i+j)^{th}$ row of pixel electrodes is being pre-charged, that is, the $(i+j)^{th}$ row of pixel electrodes is charged under the voltage of the $i^{th}$ row of pixel electrodes during the pre-charging time of the $(i+j)^{th}$ row of pixel electrodes, and then charged under the voltage of the $(i+j)^{th}$ row of pixel electrodes during the charging time of the $(i+j)^{th}$ row of pixel electrodes, wherein j is an integer greater than or equal to 2. Comparing with the prior art, more charging time is provided for the pixel electrode, so that the problem of insufficient charge of the pixel electrode can be solved to a certain extent, thereby improving display effect. In addition, in the pre-charging manner of the prior art, the pre-charging time of a latter row is less than the charging time of a former row, as a result, after the voltage of the pixel electrodes in the former row is pulled down, the time for the voltage of the former row of pixel electrodes to be pulled up back to the data line voltage is short, which may readily cause the problem of insufficient charge of the pixel electrode. However, unlike pre-charging a latter row of pixel electrodes during the charging time of a former row of pixel electrodes, in the present disclosure, when the $i^{th}$ row of pixel electrodes is being charged, the $(i+j)^{th}$ row of pixel electrodes is being pre-charged, therefore, it can be set that the pre-charging time of the $(i+j)^{th}$ row of pixel electrodes equals to the charging time of the $i^{th}$ row of pixel electrodes, and the $(i+j)^{th}$ row of pixel electrodes starts to be pre-charged from the same stage when the $i^{th}$ row of pixel electrodes starts to be charged. Therefore, the $i^{th}$ row of pixel electrodes and the $(i+j)^{th}$ row of pixel electrodes reverse their polarities at the same time, so that the problem of insufficient charge of the pixel electrode in the prior art due to mutual influence between polarities of two pixel electrodes can be solved.

An embodiment of the present disclosure provides a driving method, applied to the above gate drive circuit, the method includes: when an $i^{th}$ stage shift register outputs a high level, an $(i+j)^{th}$ stage shift register outputs a high level; when n is an even number and h is an odd number, i can be selected from h+1, h+2, h+3, . . . , and m1, wherein m1 is an integer greater than n; when n is an even number and h is an even number, i can be selected from h, h+1, h+2, . . . , and m2, wherein m2 is an integer greater than n; when n is an odd number and h is an odd number, i can be selected from h, h+1, h+2, . . . , and m3, wherein m3 is an integer greater than n; when n is an odd number and h is an even number, i can be selected from h−1, h, h+1, . . . , and m4, wherein m4 is an integer greater than n; j is an integer greater than or equal to 2.

The specific principles of the driving method can be referred to the already described principles of the gate drive circuit, which will not be repeated herein.

In the driving method according to the embodiments of the present disclosure, it is achieved that, when the $i^{th}$ row of pixel electrodes is being charged, the $(i+j)^{th}$ row of pixel electrodes is being pre-charged, that is, the (i+j)$^{th}$ row of pixel electrodes is charged under the voltage of the i$^{th}$ row of pixel electrodes during the pre-charging time of the (i+j)$^{th}$ row of pixel electrodes, and then charged under the voltage of the (i+j)$^{th}$ row of pixel electrodes during the charging time of the (i+j)$^{th}$ row of pixel electrodes, wherein j is an integer greater than or equal to 2. Comparing with the prior art, more charging time is provided for the pixel electrode, so that the problem of insufficient charge of the pixel electrode can be solved to a certain extent, thereby improving display effect. In addition, in the pre-charging manner of the prior art, the pre-charging time of a latter row is less than the charging time of a former row, as a result, after the voltage of the pixel electrodes in the former row is pulled down, the time for the voltage of the former row of pixel electrodes to be pulled up back to the data line voltage is short, which may readily cause the problem of insufficient charge of the pixel electrode. However, unlike pre-charging a latter row of pixel electrodes during the charging time of a former row of pixel electrodes, in the present disclosure, when the i$^{th}$ row of pixel electrodes is being charged, the (i+j)$^{th}$ row of pixel electrodes is being pre-charged, therefore, it can be set that the pre-charging time of the (i+j)$^{th}$ row of pixel electrodes equals to the charging time of the i$^{th}$ row of pixel electrodes, and the (i+j)$^{th}$ row of pixel electrodes starts to be pre-charged from the same stage when the i$^{th}$ row of pixel electrodes starts to be charged. Therefore, the i$^{th}$ row of pixel electrodes and the (i+j)$^{th}$ row of pixel electrodes reverse their polarities at the same time, so that the problem of insufficient charge of the pixel electrode in the prior art due to mutual influence between polarities of two pixel electrodes can be solved.

It should be noted that, the pulse generation device, the array substrate, the display panel, the display device, the drive circuit and the driving method described in the above embodiments can be adaptive to any reversing manner. For the column reversing manner, since the polarities of the sub-pixels in a same column are the same, therefore, during pre-charging, the sub-pixels can be charged toward a preset direction. For example, when the first row of sub-pixels is being charged from −5v to +5v, the third row of sub-pixels can also be pre-charged from −5v to +5v. For the row reversing manner, since two adjacent rows have opposite polarities, the odd rows have the same polarity and the even rows have the same polarity, therefore, h and n can be adjusted so that when the first row of sub-pixels is being charged, a row of sub-pixels with a same polarity as the first row of sub-pixels is being pre-charged. Similarly, for the point reversing manner, h and n can be adjusted so that when the first row of sub-pixels is being charged, a row of sub-pixels with a same polarity as the first row of sub-pixels is being pre-charged.

The above described embodiments are preferred embodiments of the present disclosure, which cannot limit the present disclosure. Any modification, equivalent replacement and improvement made within the spirit and principle of the present disclosure shall fall into the protection scope of the present disclosure.

What is claimed is:

1. A pulse generation device, comprising:
   a first input end;
   a second input end;
   a third input end;
   a pulse output end;
   a high level end;
   a low level end;
   a first inverter;
   a reset module, configured to, in response to a low level of the first input end, make the pulse output end output a low level; and the reset module is further configured to, in response to a low level of the second input end and a low level of the third input end, make the pulse output end output a low level; and
   a pulse generation module, configured to, in response to a high level of the first input end, a high level of the second input end and a low level of the third input end, make the pulse output end output a high level, the pulse generation module is further configured to, in response to a high level of the first input end, a low level of the second input end and a high level of the third input end, make the pulse output end output a high level;
   wherein the reset module comprises:
   a first transistor, a control end of the first transistor is connected with the first input end, a first end of the first transistor is connected with the high level end, a second end of the first transistor is connected with a first node;
   a second transistor, a control end of the second transistor is connected with the second input end, a first end of the second transistor is connected with the high level end; and
   a third transistor, a control end of the third transistor is connected with the third input end, a first end of the third transistor is connected with a second end of the second transistor, a second end of the third transistor is connected with the first node;
   wherein the pulse generation module comprises:
   a fourth transistor, a control end of the fourth transistor is connected with the first input end, a first end of the fourth transistor is connected with a second node, a second end of the fourth transistor is connected with the first node;
   a fifth transistor, a control end of the fifth transistor is connected with the second input end, a first end of the fifth transistor is connected with the low level end, a second end of the fifth transistor is connected with the second node; and
   a sixth transistor, a control end of the sixth transistor is connected with the third input end, a first end of the sixth transistor is connected with the low level end, a second end of the sixth transistor is connected with the second node;
   wherein an input end of the first inverter is connected with the first node, and an output end of the first inverter is connected with the pulse output end;
   the first transistor, the second transistor and the third transistor are P type transistors, the fourth transistor, the fifth transistor and the sixth transistor are N type transistors.

2. The pulse generation device according to claim 1, wherein,
   the first inverter comprises:
   a seventh transistor, a control end of the seventh transistor is connected with the first node, a first end of the seventh transistor is connected with the high level end, a second end of the seventh transistor is connected with the pulse output end; and
   an eighth transistor, a control end of the eighth transistor is connected with the first node, a first end of the eighth transistor is connected with the low level end, a second end of the eighth transistor is connected with the pulse output end;
   wherein the seventh transistor is a P type transistor, and the eighth transistor is an N type transistor.

3. A gate drive circuit, comprising:
a first clock signal end;
a second clock signal end;
a pulse generation device; and
a cascade multi-stage shift register;
wherein each stage of the cascade multi-stage shift register comprises a shift input end, an output end, a first signal end, a second signal end and a cascade signal end;
the first signal end of an odd stage shift register is connected with the first clock signal end, and the second signal end of the odd stage shift register is connected with the second clock signal end;
the first signal end of an even stage shift register is connected with the second clock signal end, and the second signal end of the even stage shift register is connected with the first clock signal end;
except for a first stage shift register and an $n^{th}$ stage shift register, the shift input end of the shift register of each stage is connected with the cascade signal end of the shift register of an upper stage, wherein n is an integer greater than 2;
the pulse generation device comprises:
a first input end;
a second input end;
a third input end;
a pulse output end;
a reset module, configured to, in response to a low level of the first input end, make the pulse output end output a low level, the reset module is further configured to, in response to a low level of the second input end and a low level of the third input end, make the pulse output end output a low level; and
a pulse generation module, configured to, in response to a high level of the first input end, a high level of the second input end and a low level of the third input end, make the pulse output end output a high level, the pulse generation module is further configured to, in response to a high level of the first input end, a low level of the second input end and a high level of the third input end, make the pulse output end output a high level;
wherein the second input end is connected with the cascade signal end of an $h^{th}$ stage shift register, h is a positive integer smaller than n−1, the third input end is connected with the cascade signal end of an $(n-1)^{th}$ stage shift register, the pulse output end is connected with the shift input end of an $n^{th}$ shift register; when n is an odd number, the first input end is connected with the first clock signal end; when n is an even number, the first input end is connected with the second clock signal end.

4. The gate drive circuit according to claim 3, wherein, h=1.

5. The gate drive circuit according to claim 4, wherein, n=3.

6. The gate drive circuit according to claim 3, wherein, the gate drive circuit further comprises a high level end, a low level end and a first inverter;
the reset module comprises:
a first transistor, a control end of the first transistor is connected with the first input end, a first end of the first transistor is connected with the high level end, a second end of the first transistor is connected with a first node;
a second transistor, a control end of the second transistor is connected with the second input end, a first end of the second transistor is connected with the high level end; and a third transistor, a control end of the third transistor is connected with the third input end, a first end of the third transistor is connected with a second end of the second transistor, a second end of the third transistor is connected with the first node;
the pulse generation module comprises:
a fourth transistor, a control end of the fourth transistor is connected with the first input end, a first end of the fourth transistor is connected with a second node, a second end of the fourth transistor is connected with the first node;
a fifth transistor, a control end of the fifth transistor is connected with the second input end, a first end of the fifth transistor is connected with the low level end, a second end of the fifth transistor is connected with the second node; and
a sixth transistor, a control end of the sixth transistor is connected with the third input end, a first end of the sixth transistor is connected with the low level end, a second end of the sixth transistor is connected with the second node;
wherein an input end of the first inverter is connected with the first node, and an output end of the first inverter is connected with the pulse output end;
the first transistor, the second transistor and the third transistor are P type transistors, the fourth transistor, the fifth transistor and the sixth transistor are N type transistors.

7. The gate drive circuit according to claim 6, wherein, the first inverter comprises:
a seventh transistor, a control end of the seventh transistor is connected with the first node, a first end of the seventh transistor is connected with the high level end, a second end of the seventh transistor is connected with the pulse output end; and
an eighth transistor, a control end of the eighth transistor is connected with the first node, a first end of the eighth transistor is connected with the low level end, a second end of the eighth transistor is connected with the pulse output end;
wherein the seventh transistor is a P type transistor, and the eighth transistor is an N type transistor.

8. The gate drive circuit according to claim 6, wherein, the shift register of each stage comprises:
a second inverter, an input end of the second inverter is connected with the first signal end of the shift register of a present stage;
a ninth transistor, a control end of the ninth transistor is connected with an output end of the second inverter, a first end of the ninth transistor is connected with the high level end;
a tenth transistor, a control end of the tenth transistor is connected with the shift input end of the shift register of the present stage, a first end of the tenth transistor is connected with a second end of the ninth transistor, a second end of the tenth transistor is connected with a third node;
an eleventh transistor, a control end of the eleventh transistor is connected with the first signal end, a first end of the eleventh transistor is connected with the low level end;
a twelfth transistor, a control end of the twelfth transistor is connected with the shift input end of the shift register of the present stage, a first end of the twelfth transistor is connected with a second end of the eleventh transistor, a second end of the twelfth transistor is connected with the third node;

a third inverter, an input end of the third inverter is connected with the third node, an output end of the third inverter is connected with the cascade signal end of the shift register of the present stage;

a thirteenth transistor, a control end of the thirteenth transistor is connected with the first signal end, a first end of the thirteenth transistor is connected with the high level end;

a fourteenth transistor, a control end of the fourteenth transistor is connected with the cascade signal end of the shift register of the present stage, a first end of the fourteenth transistor is connected with a second end of the thirteenth transistor, a second end of the fourteenth transistor is connected with the third node;

a fifteenth transistor, a control end of the fifteenth transistor is connected with an output end of the second inverter, a first end of the fifteenth transistor is connected with the low level end;

a sixteenth transistor, a control end of the sixteenth transistor is connected with the cascade signal end of the shift register of the present stage, a first end of the sixteenth transistor is connected with a second end of the fifteenth transistor, a second end of the sixteenth transistor is connected with the third node;

a seventeenth transistor, a control end of the seventeenth transistor is connected with the cascade signal end of the shift register of the present stage, a first end of the seventeenth transistor is connected with the high level end, a second end of the seventeenth transistor is connected with a fourth node;

an eighteenth transistor, a control end of the eighteenth transistor is connected with the second signal end, a first end of the eighteenth transistor is connected with the high level end, a second end of the eighteenth transistor is connected with the fourth node;

a nineteenth transistor, a control end of the nineteenth transistor is connected with the cascade signal end of the shift register of the present stage, a first end of the nineteenth transistor is connected with the low level end; and a twentieths transistor, a control end of the twentieths transistor is connected with the second signal end, a first end of the twentieth transistor is connected with a second end of the nineteenth transistor, a second end of the twentieths transistor is connected with the fourth node;

wherein the fourth node is connected with an output end of the shift register of the present stage through a fourth inverter, a fifth inverter and a sixth inverter which are connected in series;

the ninth transistor, the tenth transistor, the thirteenth transistor, the fourteenth transistor, the seventeenth transistor and the eighteenth transistor are P type transistors, and the eleventh transistor, the twelfth transistor, the fifteenth transistor, the sixteenth transistor, the nineteenth transistor and the twentieth transistor are N type transistors.

9. The gate drive circuit according to claim 8, wherein, each of the second inverter, the third inverter, the fourth inverter, the fifth inverter and the sixth inverter comprises:

a pull-up transistor, a control end of the pull-up transistor is connected with an input end of a present inverter, a first end of the pull-up transistor is connected with the high level end, a second end of the pull-up transistor is connected with an output end of the present inverter; and a pull-down transistor, a control end of the pull-down transistor is connected with the input end of the present inverter, a first end of the pull-down transistor is connected with the low level end, a second end of the pull-down transistor is connected with the output end of the present inverter;

wherein the pull-up transistor is a P type transistor, and the pull-down transistor is an N type transistor.

10. An array substrate, comprising a gate drive circuit, wherein the gate drive circuit comprises:

a first clock signal end;
a second clock signal end;
a pulse generation device; and
a cascade multi-stage shift register;

wherein each stage of the cascade multi-stage shift register comprises a shift input end, an output end, a first signal end, a second signal end and a cascade signal end;

the first signal end of an odd stage shift register is connected with the first clock signal end, and the second signal end of the odd stage shift register is connected with the second clock signal end;

the first signal end of an even stage shift register is connected with the second clock signal end, and the second signal end of the even stage shift register is connected with the first clock signal end;

except for a first stage shift register and an $n^{th}$ stage shift register, the shift input end of the shift register of each stage is connected with the cascade signal end of the shift register of an upper stage, wherein n is an integer greater than 2;

the pulse generation device comprises:
a first input end;
a second input end;
a third input end;
a pulse output end;
a reset module, configured to, in response to a low level of the first input end, make the pulse output end output a low level, the reset module is further configured to, in response to a low level of the second input end and a low level of the third input end, make the pulse output end output a low level; and a pulse generation module, configured to, in response to a high level of the first input end, a high level of the second input end and a low level of the third input end, make the pulse output end output a high level, the pulse generation module is further configured to, in response to a high level of the first input end, a low level of the second input end and a high level of the third input end, make the pulse output end output a high level;

wherein the second input end is connected with the cascade signal end of an $h^{th}$ stage shift register, h is a positive integer smaller than n−1, the third input end is connected with the cascade signal end of an $(n-1)^{th}$ stage shift register, the pulse output end is connected with the shift input end of an $n^{th}$ shift register; when n is an odd number, the first input end is connected with the first clock signal end; when n is an even number, the first input end is connected with the second clock signal end.

11. A driving method, applied to a gate drive circuit, wherein the method comprises:

when an $i^{th}$ stage shift register outputs a high level, an $(i+j)^{th}$ stage shift register outputs a high level;

when n is an even number and h is an odd number, i is selected from a group consisting of h+1, h+2, h+3, ..., and m1, wherein m1 is an integer greater than n;

when n is an even number and h is an even number, i is selected from a group consisting of h, h+1, h+2, ..., and m2, wherein m2 is an integer greater than n;

when n is an odd number and h is an odd number, i is selected from a group consisting of h, h+1, h+2, ..., and m3, wherein m3 is an integer greater than n; and when n is an odd number and h is an even number, i is selected from a group consisting of h−1, h, h+1, ..., and m4, wherein m4 is an integer greater than n;

j is an integer greater than or equal to 2 wherein the gate drive circuit comprises:

a first clock signal end;

a second clock signal end;

a pulse generation device; and a cascade multi-stage shift register;

wherein each stage of the cascade multi-stage shift register comprises a shift input end, an output end, a first signal end, a second signal end and a cascade signal end;

the first signal end of an odd stage shift register is connected with the first clock signal end, and the second signal end of the odd stage shift register is connected with the second clock signal end;

the first signal end of an even stage shift register is connected with the second clock signal end, and the second signal end of the even stage shift register is connected with the first clock signal end;

except for a first stage shift register and an $n^{th}$ stage shift register, the shift input end of the shift register of each stage is connected with the cascade signal end of the shift register of an upper stage, wherein n is an integer greater than 2;

the pulse generation device comprises:

a first input end;

a second input end;

a third input end;

a pulse output end;

a reset module, configured to, in response to a low level of the first input end, make the pulse output end output a low level, the reset module is further configured to, in response to a low level of the second input end and a low level of the third input end, make the pulse output end output a low level; and a pulse generation module, configured to, in response to a high level of the first input end, a high level of the second input end and a low level of the third input end, make the pulse output end output a high level, the pulse generation module is further configured to, in response to a high level of the first input end, a low level of the second input end and a high level of the third input end, make the pulse output end output a high level;

wherein the second input end is connected with the cascade signal end of an $h^{th}$ stage shift register, h is a positive integer smaller than n−1, the third input end is connected with the cascade signal end of an $(n-1)^{th}$ stage shift register, the pulse output end is connected with the shift input end of an $n^{th}$ shift register; when n is an odd number, the first input end is connected with the first clock signal end; when n is an even number, the first input end is connected with the second clock signal end.

* * * * *